US011735499B2

(12) United States Patent
Huang et al.

(10) Patent No.: US 11,735,499 B2
(45) Date of Patent: Aug. 22, 2023

(54) SEMICONDUCTOR DEVICE WITH PROTECTION LAYERS AND METHOD FOR FABRICATING THE SAME

(71) Applicant: NANYA TECHNOLOGY CORPORATION, New Taipei (TW)

(72) Inventors: Tse-Yao Huang, Taipei (TW); Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 113 days.

(21) Appl. No.: 17/529,520

(22) Filed: Nov. 18, 2021

(65) Prior Publication Data
US 2022/0077025 A1 Mar. 10, 2022

Related U.S. Application Data

(62) Division of application No. 16/908,022, filed on Jun. 22, 2020, now Pat. No. 11,302,608.

(51) Int. Cl.
*H01L 23/48* (2006.01)
*H01L 23/532* (2006.01)
*H01L 23/00* (2006.01)
*H01L 21/768* (2006.01)

(52) U.S. Cl.
CPC ...... *H01L 23/481* (2013.01); *H01L 21/76802* (2013.01); *H01L 21/76877* (2013.01); *H01L 23/53238* (2013.01); *H01L 24/80* (2013.01); *H01L 2224/80895* (2013.01); *H01L 2224/80896* (2013.01)

(58) Field of Classification Search
CPC ... H01L 23/481; H01L 25/0657; H01L 25/50; H01L 24/16; H01L 24/13; H01L 24/05
See application file for complete search history.

(56) References Cited

U.S. PATENT DOCUMENTS

| 2012/0168935 | A1 | 7/2012 | Huang |
| 2013/0015504 | A1 | 1/2013 | Kuo et al. |
| 2019/0115322 | A1* | 4/2019 | Tsai ........................ H01L 25/50 |

OTHER PUBLICATIONS

Office Action dated Feb. 15, 2022 related to Taiwanese Application No. 110114049.

* cited by examiner

*Primary Examiner* — Jaehwan Oh
*Assistant Examiner* — John M Parker
(74) *Attorney, Agent, or Firm* — Xuan Zhang

(57) ABSTRACT

The present application discloses a semiconductor device and a method for fabricating the semiconductor device. The semiconductor device includes a first die, a first conductive feature positioned in the first die, a second die positioned on the first die, a first mask layer positioned on the second die, a second mask layer positioned on the first mask layer, a conductive filler layer positioned penetrating the second mask layer, the first mask layer, and the second die, extending to the first die, and contacting the first conductive feature, isolation layers positioned between the conductive filler layer and the first die, between the conductive filler layer and the second die, and between the conductive filler layer and the first mask layer, and protection layers positioned between the conductive filler layer and the second mask layer and between the conductive filler layer and the first mask layer, and covering upper portions of the isolation layers.

3 Claims, 31 Drawing Sheets

SEMICONDUCTOR DEVICE WITH PROTECTION LAYERS AND METHOD FOR FABRICATING THE SAME

CROSS-REFERENCE TO RELATED APPLICATION

This application is a divisional application of U.S. Non-Provisional application Ser. No. 16/908,022 filed on Jun. 22, 2020, which is incorporated herein by reference in its entirety.

TECHNICAL FIELD

The present disclosure relates to a semiconductor device and a method for fabricating the semiconductor device, and more particularly, to a semiconductor device with protection layers and a method for fabricating the semiconductor device with the protection layers.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first die, a first conductive feature positioned in the first die, a second die positioned on the first die, a first mask layer positioned on the second die, a second mask layer positioned on the first mask layer, a conductive filler layer positioned penetrating the second mask layer, the first mask layer, and the second die, extending to the first die, and contacting the first conductive feature, isolation layers positioned between the conductive filler layer and the first die, between the conductive filler layer and the second die, and between the conductive filler layer and the first mask layer, and protection layers positioned between the conductive filler layer and the second mask layer and between the conductive filler layer and the first mask layer, and covering upper portions of the isolation layers.

In some embodiments, topmost points of the isolation layers are at a vertical level above a vertical level of a bottom surface of the first mask layer.

In some embodiments, interfaces between the second mask layer and the protection layers are tapered.

In some embodiments, an angle between a top surface of the second mask layer and the interfaces between the second mask layer and the protection layers is between about 120 degree and 135 degree.

In some embodiments, interfaces between the protection layers and the conductive filler layer are substantially vertical.

In some embodiments, the conductive filler layer is formed of polysilicon, tungsten, copper, carbon nanotube, or solder alloy, and the isolation layers are formed of silicon oxide, silicon nitride, silicon oxynitride, tetra-ethyl orthosilicate, parylene, epoxy, or poly(p-xylene).

In some embodiments, the semiconductor device includes a barrier layer positioned between the isolation layers and the conductive filler layer. The barrier layer is formed of tantalum, tantalum nitride, titanium, titanium nitride, rhenium, nickel boride, or tantalum nitride/tantalum bilayer.

In some embodiments, the semiconductor device includes an adhesion layer positioned between the barrier layer and the conductive filler layer. The adhesion layer is formed of titanium, tantalum, titanium tungsten, or manganese nitride.

In some embodiments, the semiconductor device includes a seed layer positioned between the adhesion layer and the conductive filler layer. The seed layer has a thickness between about 10 nm and about 40 nm.

In some embodiments, a width of the conductive filler layer is between about 1 μm and about 22 μm.

In some embodiments, a depth of the conductive filler layer is about 20 μm and about 160 μm.

In some embodiments, an aspect ratio of the conductive filler layer is between about 1:2 and about 1:35.

In some embodiments, interfaces between the second mask layer and the protection layers are substantially vertical.

Another aspect of the present disclosure provides a semiconductor device including a first die, a first conductive feature positioned in the first die, a first mask layer positioned on the first die, a second mask layer positioned on the first mask layer, a conductive filler layer positioned penetrating the second mask layer and the first mask layer, extending to the first die, and contacting the first conductive feature, isolation layers positioned between the conductive filler layer and the first die, between the conductive filler layer and the first mask layer, and between the conductive filler layer and the second mask layer, and protection layers positioned between the conductive filler layer and the isolation layers. Bottommost points of the protection layers are at a vertical level above a vertical level of a bottom surface of the first mask layer.

In some embodiments, interfaces between the second mask layer and the isolation layers are tapered.

In some embodiments, interfaces between the conductive filler layer and the protection layers are substantially vertical.

Another aspect of the present disclosure provides a method for fabricating a semiconductor device including performing a bonding process to bond a second die onto a first die, forming a first mask layer on the second die and forming a second mask layer on the first mask layer, forming a first opening penetrating the second mask layer, the first mask layer, and the second die, and extending to the first die, forming isolation layers on sidewalls of the first opening, forming protection layers covering upper portions of the isolation layers, and forming a conductive filler layer in the first opening.

In some embodiments, the method for fabricating the semiconductor device includes a step of performing an etch process to expand the first opening in the second mask layer before the step of forming the isolation layers on the sidewalls of the first opening.

In some embodiments, the etch process has an etch rate ratio of the second mask layer to the first mask layer between about 100:1 and about 1.05:1.

In some embodiments, the protection layers are formed of aluminum oxide, hafnium oxide, zirconium oxide, titanium oxide, titanium nitride, tungsten nitride, silicon nitride, or silicon oxide.

Due to the design of the semiconductor device of the present disclosure, the protection layers may provide additional protection to avoid the metal to silicon leakage. In addition, due to the geometry of the protection layers, the conductive filler layer may be formed without any void. In summary, the yield of fabrication of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
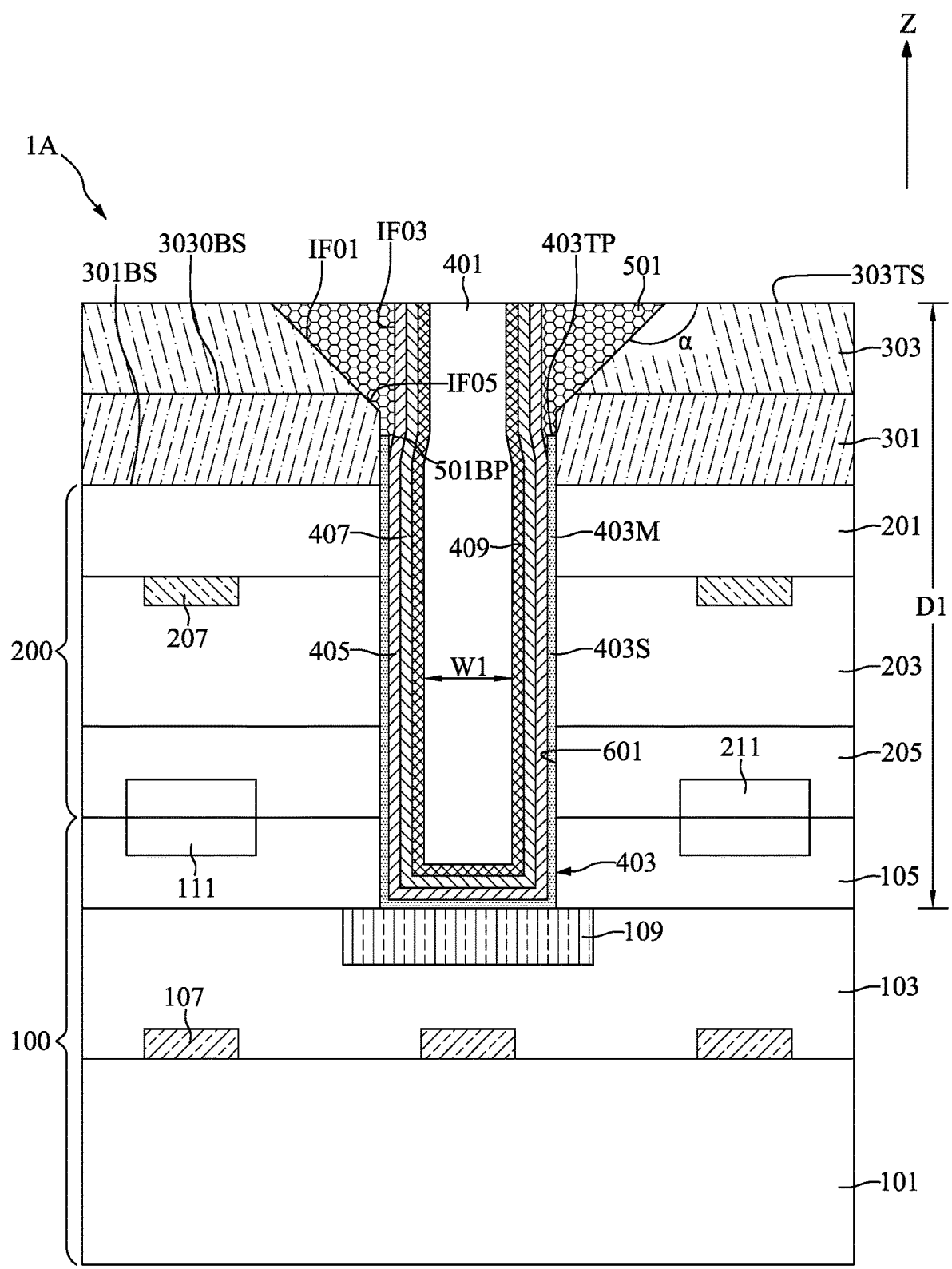
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional view diagram, a semiconductor device 1A in accordance with one embodiment of the present disclosure.

With reference to FIG. 1, the semiconductor device 1A may include a first die 100, a second die 200, a first mask layer 301, a second mask layer 303, a conductive filler layer 401, isolation layers 403, a barrier layer 405, an adhesion layer 407, a seed layer 409, and protection layers 501.

With reference to FIG. 1, the first die 100 may include a first substrate 101, a first dielectric layer 103, a first passivation layer 105, first device elements 107, a first conductive feature 109, and first dummy conductive features 111.

With reference to FIG. 1, the first substrate 101 may be formed of, for example, silicon, germanium, silicon germanium, silicon carbon, silicon germanium carbon, gallium, gallium arsenide, indium arsenide, indium phosphorus or other IV-IV, III-V or II-VI semiconductor materials. In some embodiments, the substrate 101 may include an organic semiconductor or a layered semiconductor such as silicon/silicon germanium, silicon-on-insulator, or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride, or any combination thereof.

With reference to FIG. 1, the first dielectric layer 103 may be disposed on the first substrate 101. In some embodiments, the first dielectric layer 103 may be a stacked layer structure. The first dielectric layer 103 may include a plurality of first insulating sub-layers. Each of the plurality of first insulating sub-layers may have a thickness between about 0.5 μm and about 3.0 μm. The plurality of first insulating sub-layers may be formed of, for example, silicon oxide, borophosphosilicate glass, undoped silicate glass, fluorinated silicate glass, low-k dielectric materials, the like, or a combination thereof. The plurality of first insulating sub-layers may be formed of different materials but are not limited thereto. The low-k dielectric materials may have a dielectric constant less than 3.0 or even less than 2.5. In some embodiments, the low-k dielectric materials may have a dielectric constant less than 2.0.

With reference to FIG. 1, the first passivation layer 105 may be disposed on the first dielectric layer 103. In some embodiments, the first passivation layer 105 may be a multi-layered structure including a layer of silicon oxide and a layer of silicon nitride.

With reference to FIG. 1, the first device elements 107 may be disposed in a lower portion of the first dielectric layer 103. In some embodiments, the first device elements 107 may be disposed on the first substrate 101 (only three first device elements 107 are shown in FIG. 1 for clarity).

The first device elements 107 may be, for example, bipolar junction transistors, metal-oxide-semiconductor field-effect transistors, diodes, flash memories, dynamic random-access memories, static random-access memories, electrically erasable programmable read-only memories, image sensors, micro-electro-mechanical systems, active devices, or passive devices.

With reference to FIG. 1, the first conductive feature 109 may be disposed in the first dielectric layer 103. In the embodiment depicted, the first conductive feature 109 may be a conductive line. It should be noted that other conductive features such as conductive lines, conductive vias, conductive contacts, landing pads are also disposed in the first dielectric layer 103, but are not shown in FIG. 1 for clarity. The first conductive feature 109 may be formed of, for example, aluminum, copper, titanium, the like, or combination thereof. The first conductive feature 109 and the first device elements 107 may be electrically coupled.

With reference to FIG. 1, the first dummy conductive features 111 may be disposed in the first passivation layer 105. The top surfaces of the first dummy conductive features 111 may be substantially coplanar with the top surface of the first passivation layer 105. The first dummy conductive features 111 may be formed of, for example, aluminum, copper, titanium, the like, or combination thereof.

It should be noted that referring to an element as a "dummy" element means that no exterior voltage or current is applied to the element when the semiconductor device is in operation.

With reference to FIG. 1, the second die 200 may be disposed on the first die 100. In some embodiments, the first die 100 and the second die 200 may provide different functionalities. For example, the first die 100 may provide a logic function and the second die 200 may provide a memory function. In some embodiments, the first die 100 and the second die 200 may provide the same functionality.

With reference to FIG. 1, in some embodiments, the second die 200 may have a structure similar to that of the first die 100 but placed in an up-side down manner. Specifically, the second die 200 may include a second substrate 201, a second dielectric layer 203, a second passivation layer 205, second device elements 207, second conductive features (not shown), and second dummy conductive features 211.

With reference to FIG. 1, the second passivation layer 205 may be disposed on the first passivation layer 105. The second dielectric layer 203 may be disposed on the second passivation layer 205. The second substrate 201 may be disposed on the second dielectric layer 203. The second device elements 207 may be disposed in the second dielectric layer 203 and adjacent to the second substrate 201. The second conductive features (not shown in FIG. 1 for clarity) may be disposed in the second dielectric layer 203. The second dummy conductive features 211 may be disposed in the second passivation layer 205 and may contact the first dummy conductive features 111. The second dummy conductive features 211 and the first dummy conductive features 111 may facilitate a bonding process between the first die 100 and the second die 200 and may improve the bonding strength between the second die 200 and the first die 100.

With reference to FIG. 1, the first mask layer 301 may be disposed on the second substrate 201. The second mask layer 303 may be disposed on the first mask layer 301. In some embodiments, the first mask layer 301 and the second mask layer 303 may be formed of, for example, silicon oxide, silicon nitride, silicon oxynitride, silicon nitride oxide, or the like. The first mask layer 301 and the second mask layer 303 may be formed of different material but are not limited thereto. In some embodiments, the second mask layer 303 may be formed of a material having a higher etch rate comparing to the first mask layer 301. For example, an etch rate ratio of the second mask layer 303 to the first mask layer 301 may be between about 100:1 and about 1.05:1. For another example, the etch rate ratio of the second mask layer 303 to the first mask layer 301 may be between about 20:1 and about 10:1.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1, the conductive filler layer 401 may be disposed penetrating the second mask layer 303, the first mask layer 301, the second substrate 201, the second dielectric layer 203, the second passivation layer 205, and the first passivation layer 105, extending to the first dielectric layer 103, and contacting the first conductive feature 109. The conductive filler layer 401 and the first conductive feature 109 are electrically coupled. The top surface of the conductive filler layer 401 may be substantially coplanar with the top surface 303TS of the second mask layer 303.

In some embodiments, the conductive filler layer 401 may have a width W1 between about 1 μm and about 22 μm. Specifically, the width W1 of the conductive filler layer 401 may be between about μm and about 15 μm. In some embodiments, the conductive filler layer 401 may have a depth D1 between about 20 μm and about 160 μm. Specifically, the depth D1 of the conductive filler layer 401 may be between about 50 μm and about 130 μm. In some embodiments, the conductive filler layer 401 may have an aspect ratio between about 1:2 and about 1:35. Specifically, the aspect ratio of the conductive filler layer 401 may be between about 1:10 and about 1:25. The conductive filler layer 401 may be formed of, for example, polysilicon, tungsten, copper, carbon nanotube, or solder alloy.

With reference to FIG. 1, the seed layer 409 may be disposed on the sidewalls and the bottom surface of the conductive filler layer 401. The top surfaces of the seed layer 409 may be substantially coplanar with the top surface of the conductive filler layer 401. The seed layer 409 may have a thickness between about 10 nm and about 40 nm. The seed layer 409 may be formed of, for example, copper. The seed layer 409 may reduce a resistivity of an opening during the formation of the conductive filler layer 401.

With reference to FIG. 1, the adhesion layer 407 may be disposed on the sidewalls and the bottom surface of the seed layer 409. The top surfaces of the adhesion layer 407 may be substantially coplanar with the top surface of the conductive filler layer 401. The adhesion layer 407 may be formed of, for example, titanium, tantalum, titanium tungsten, or manganese nitride. The adhesion layer 407 may improve an adhesion between the seed layer 409 and the barrier layer 405.

With reference to FIG. 1, the barrier layer 405 may be disposed on the sidewalls and the bottom surface of the adhesion layer 407. The top surfaces of the barrier layer 405 may be substantially coplanar with the top surface of the conductive filler layer 401. The barrier layer 405 may be formed of, for example, tantalum, tantalum nitride, titanium, titanium nitride, rhenium, nickel boride, or tantalum nitride/tantalum bilayer. The barrier layer 405 may inhibit diffusion of the conductive materials of the conductive filler layer 401 into the second dielectric layer 203, the second substrate 201, the second passivation layer 205, the first passivation layer 105, or the first dielectric layer 103.

With reference to FIG. 1, the isolation layers 403 may be formed on the sidewalls of the barrier layer 405. For convenience of description, only one isolation layer 403 is described. The portion of the isolation layer 403 disposed below the bottom surface 301BS of the first mask layer 301 may be referred to as the side segment 403S of the isolation layer 403. The portion of the isolation layer 403 disposed between the bottom surface 301BS of the first mask layer 301 and the bottom surface 303BS of the second mask layer 303 may be referred to as the middle segment 403M of the isolation layer 403.

With reference to FIG. 1, the side segment 403S may be disposed between the conductive filler layer 401 and the second die 200 and between the conductive filler layer 401 and the first passivation layer 105. In some embodiments, the side segment 403S may be disposed between the conductive filler layer 401 and the first dielectric layer 103. The lower end of the side segment 403S may contact the first conductive feature 109. The middle segment 403M may disposed between the conductive filler layer 401 and the first mask layer 301. In some embodiments, the topmost points 403TP of the isolation layers 403 may be at a vertical level above the bottom surface 301BS of the first mask layer 301. In some embodiments, the topmost points 403TP of the isolation layer 403 may be at a vertical level lower than the bottom surface 301BS of the first mask layer 301 and above the bottom surface 201BS of the second substrate 201.

In some embodiments, the isolation layers 403 may be formed of a material having a higher etch rate comparing to the second mask layer 303. For example, an etch rate ratio of the isolation layers 403 to the second mask layer 303 may be between about 100:1 and about 1.05:1. For another example, the etch rate ratio of the isolation layers 403 to the second mask layer 303 may be between about 20:1 and about 10:1. In some embodiments, the isolation layers 403 may be formed of, for example, silicon oxide, silicon nitride, silicon oxynitride, or tetra-ethyl ortho-silicate. The isolation layers 403 may have a thickness between about 50 nm and about 200 nm. In some embodiments, the isolation layers 403 may be formed of, for example, parylene, epoxy, or poly(p-xylene). The isolation layers 403 may have a thickness between about 1 μm and about 5 μm. The isolation layers 403 may ensure the conductive filler layer 401 is electrically isolated in the second die 200 and the first passivation layer 105.

The conductive filler layer 401 may decrease interconnection length between the first die 100 and the second die 200. As a result, reflection noise, crosstalk noise, simultaneous switching noise, electromagnetic interference, and latency of the semiconductor device 1A may be reduced. Additionally, as the parasitic capacitance is proportional to the interconnection length, the total power consumption in the semiconductor device 1A may be also reduced because of the reduced parasitic capacitance.

With reference to FIG. 1, the protection layers 501 may be disposed between the barrier layer 405 and the second mask layer 303, between the barrier layer 405 and the first mask layer 301, and between the barrier layer 405 and the middle segments 403M of the isolation layers 403. The protection layers 501 may cover the upper portions of the middle segments 403M. The bottommost points 501BP of the protection layers 501 may be at a vertical level lower than the vertical level of the topmost points 403TP of the isolation layers 403. The top surfaces of the protection layers 501 may be substantially coplanar with the top surface 303TS of the second mask layer 303.

With reference to FIG. 1, the interfaces IF01 between the second mask layer 303 and the protection layers 501 may be tapered. The angle between the top surface 303TS of the second mask layer 303 and the interfaces IF01 between the second mask layer 303 and the protection layers 501 may be between about 120 degree and 135 degree. The interfaces IF03 between the protection layers 501 and the barrier layer 405 may be substantially vertical. In some embodiments, the interfaces IF05 between the protection layers 501 and the upper portion of the first mask layer 301 may be tapered.

The protection layers 501 may be formed of, for example, aluminum oxide, hafnium oxide, zirconium oxide, titanium oxide, titanium nitride, tungsten nitride, silicon nitride, or silicon oxide.

Without the presence of the protection layers 501, the isolation layers 403 may be damaged during formation of the isolation layers 403, and a metal to silicon leakage may be subsequently induced during formation of the conductive filler layer 401. As a result, the performance/yield of the semiconductor device 1A may be affected. In contrast, in the embodiment depicted, the protection layers 501 may form a barrier to prevent metal of the conductive filler layer 401 diffusing into the second die 200 or the first die 100 during formation of the conductive filler layer 401. Therefore, the performance/reliability of the semiconductor device 1A may be improved.

FIGS. 2 to 6 illustrate, in schematic cross-sectional view diagrams, semiconductor devices 1B, 1C, 1D, 1E, and 1F in accordance with some embodiments of the present disclosure.

Figure 2:
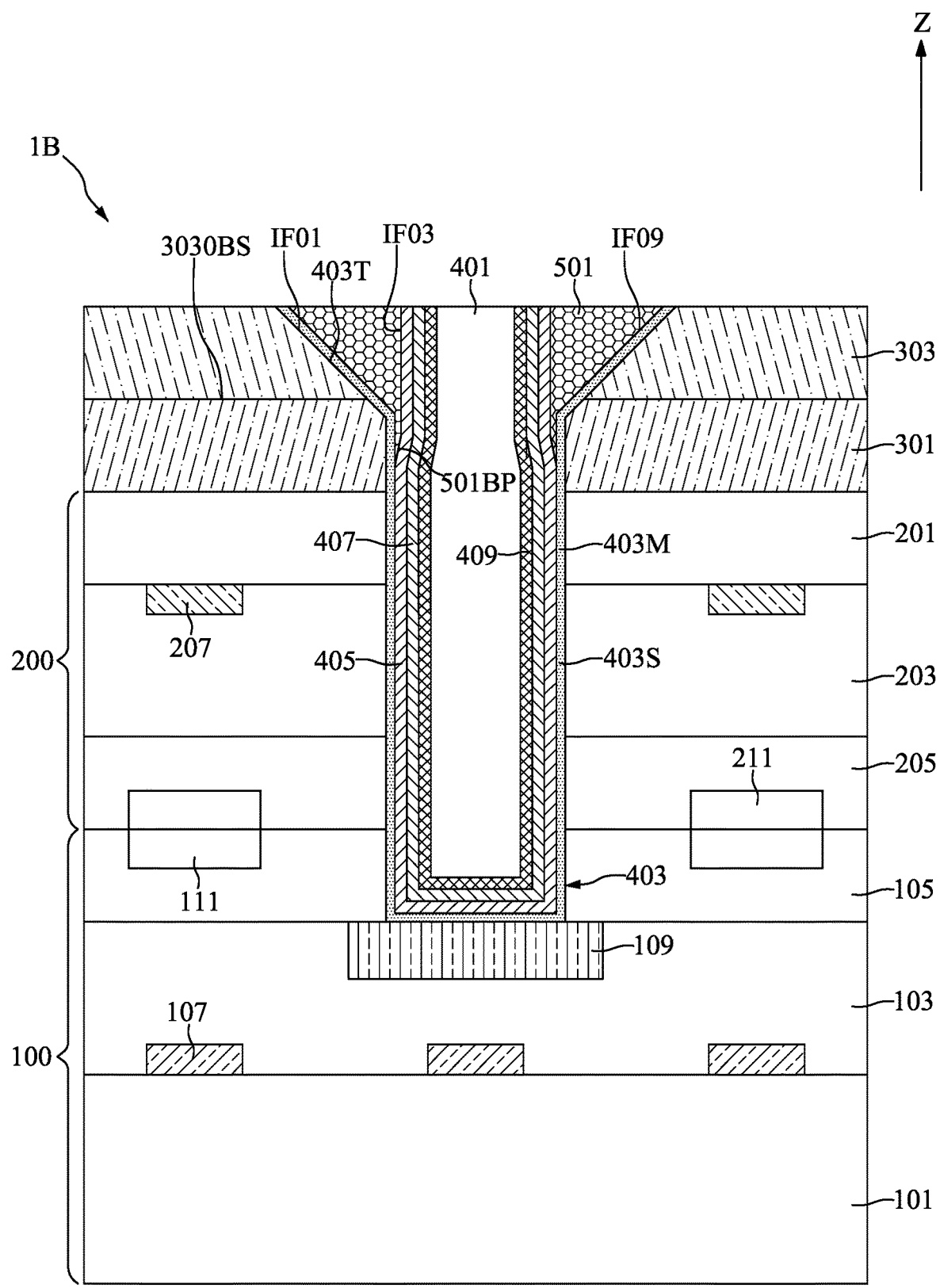
FIGS. 2 to 6 illustrate, in schematic cross-sectional view diagrams, semiconductor devices in accordance with some embodiments of the present disclosure.

With reference to FIG. 2, in the semiconductor device 1B, the isolation layer 403 further including a top segment 403T which is the portion of the isolation layer 403 disposed above the bottom surface 303BS of the second mask layer 303. The top segment 403T may be disposed between the protection layer 501 and the second mask layer 303. The interfaces IF07 between the top segments 403T and the second mask layer 303 may be tapered. The interfaces IF09 between the top segments 403T and the protection layers 501 may be tapered. In some embodiments, the interfaces IF03 between the protection layers 501 and the barrier layer 405 may be substantially vertical. In some embodiments, the interfaces IF03 between the protection layers 501 and the barrier layer 405 may be tapered.

Figure 3:
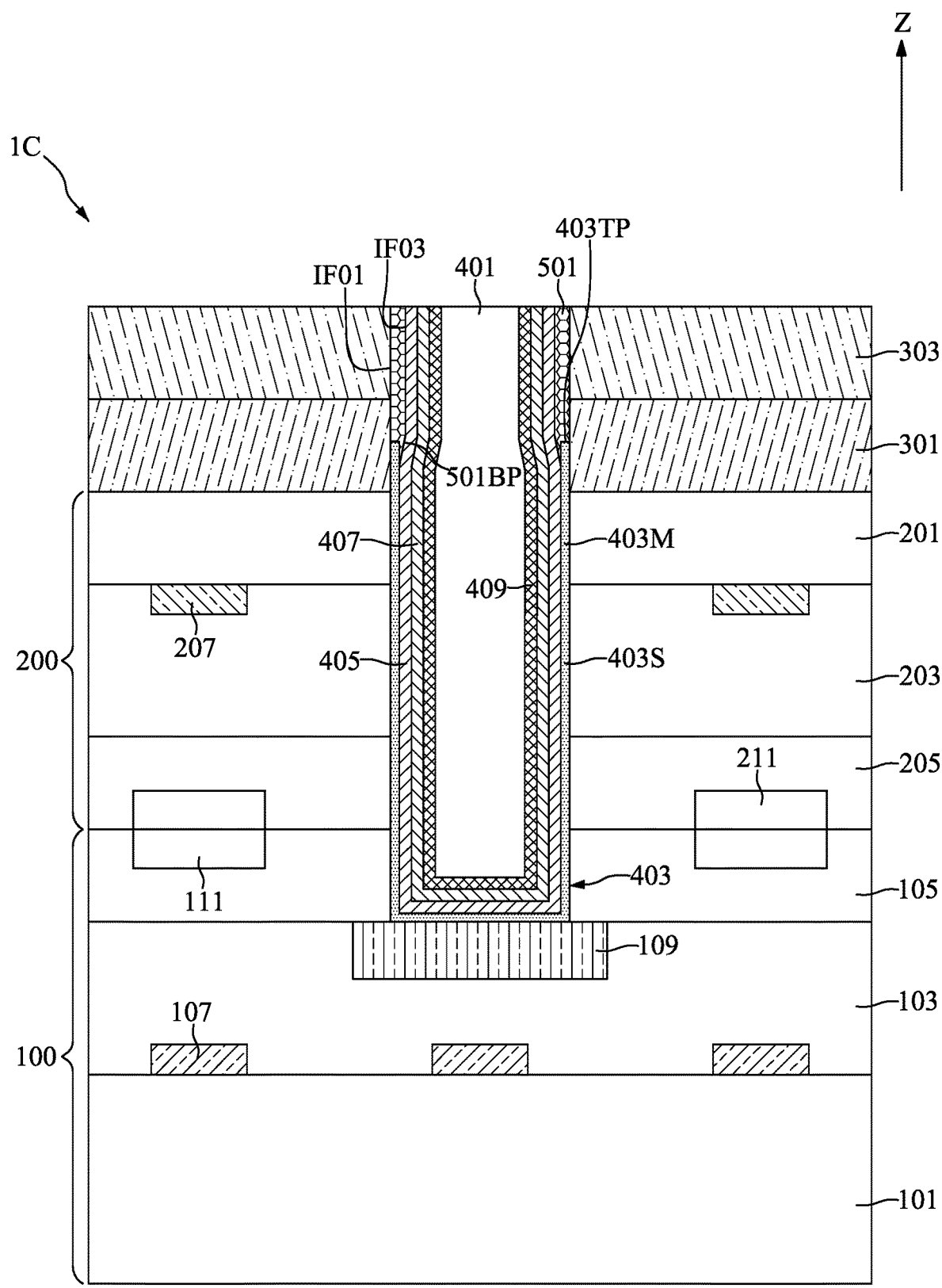

With reference to FIG. 3, in the semiconductor device 1C, the interfaces IF01 between the second mask layer 303 and the protection layers 501 may be substantially vertical. The interfaces IF03 between the protection layers 501 and the barrier layer 405 may be substantially vertical.

Figure 4:
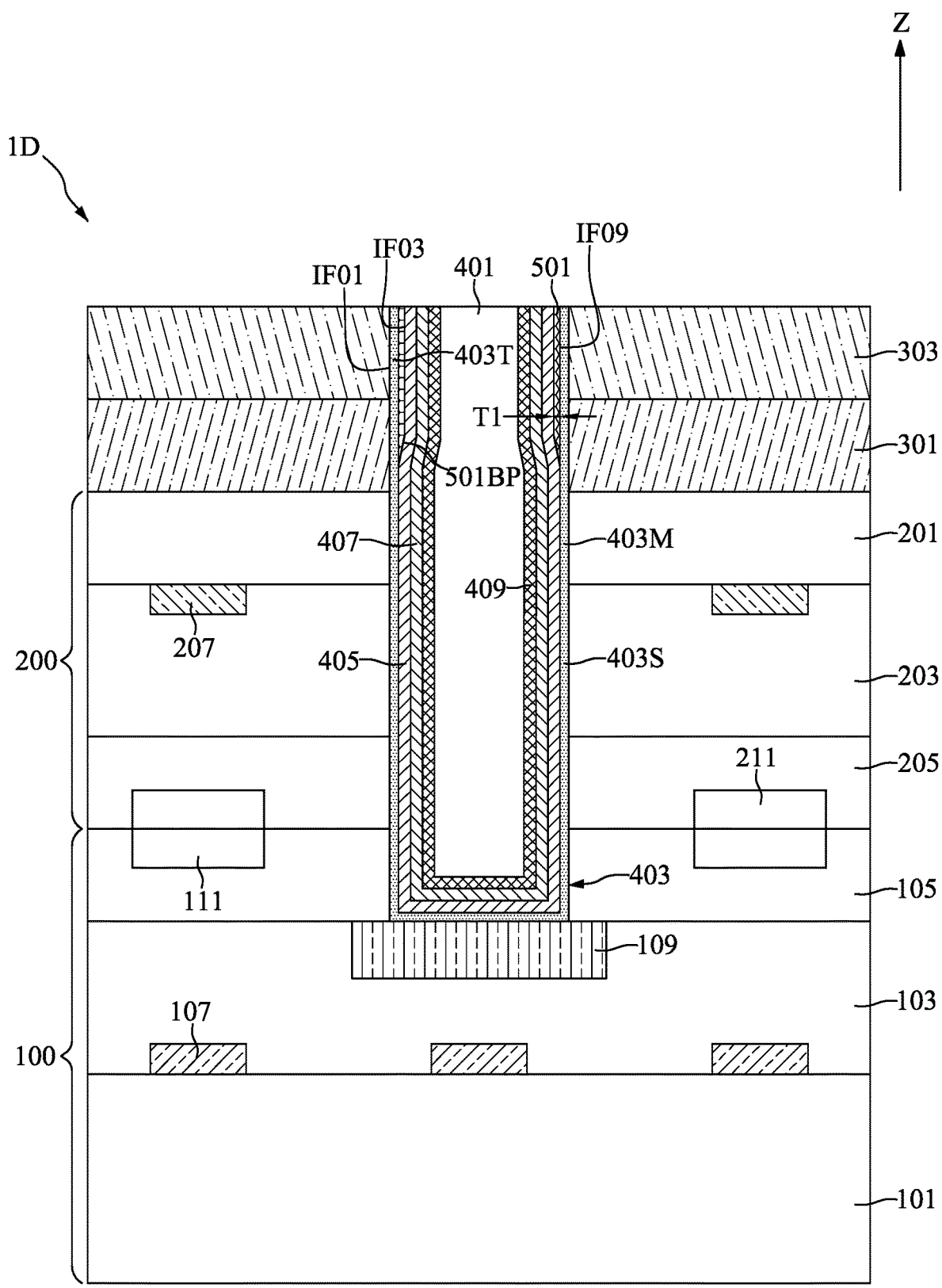

With reference to FIG. 4, in the semiconductor device 1D, the interfaces IF07 between the top segments 403T and the second mask layer 303 may be substantially vertical. The interfaces IF09 between the top segments 403T and the protection layers 501 may be substantially vertical. A thickness T1 of the protection layers 501 may be gradually decreased along the direction Z toward the second die 200.

Figure 5:
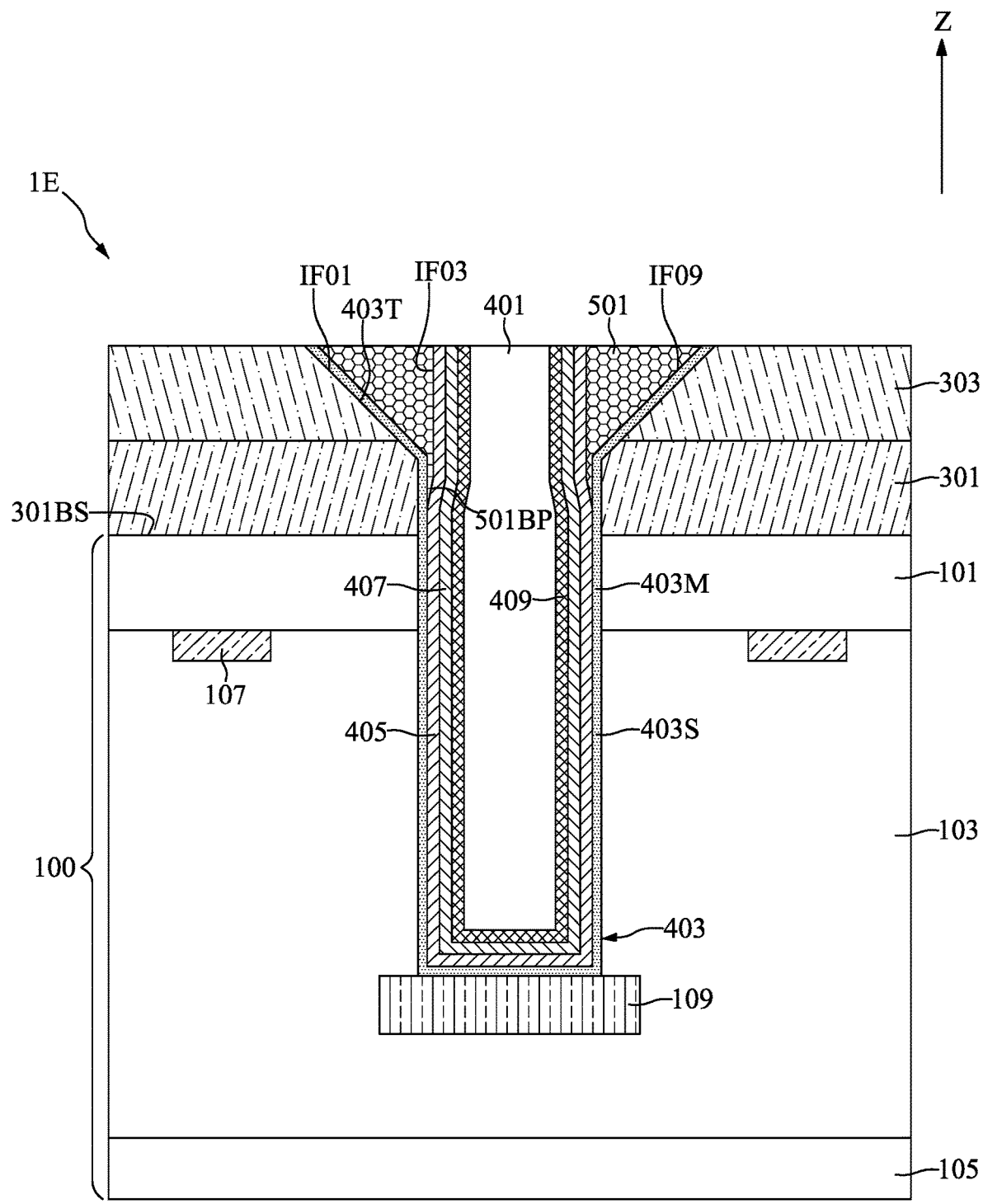

With reference to FIG. 5, in the semiconductor device 1E, the first dielectric layer 103 may be disposed on the first passivation layer 105. The first substrate 101 may be disposed on the first dielectric layer 103. The first mask layer 301 and the second mask layer 303 may be stacked on the first substrate 101. The conductive filler layer 401 may be disposed penetrating the second mask layer 303, the first mask layer 301, and the first substrate 101, extending to the first dielectric layer 103, and contacting the first conductive feature 109. The isolation layers 403 may be disposed between the second mask layer 303 and the protection layers 501, between the first mask layer 301 and the protection layers 501, and between the first die 100 and the protection layers 501. The interfaces IF07 between the top segments 403T and the second mask layer 303 may be tapered. The interfaces IF09 between the top segments 403T and the protection layers 501 may be tapered. In some embodiments, the interfaces IF03 between the protection layers 501 and the barrier layer 405 may be substantially vertical.

Figure 6:
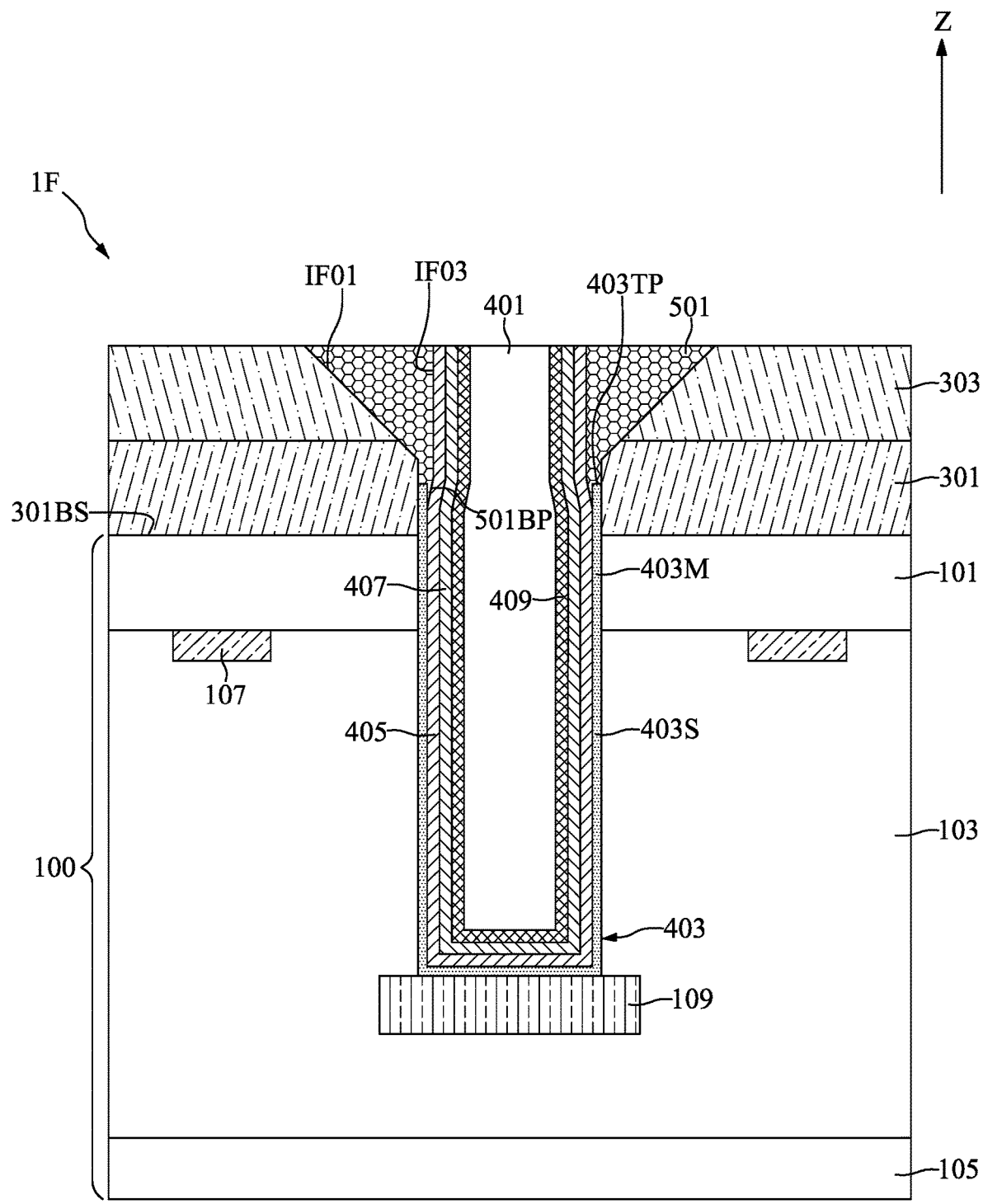

With reference to FIG. 6, in the semiconductor device 1F, the topmost points 403TP of the isolation layers 403 may be at a vertical level above the bottom surface 301BS of the first mask layer 301. The protection layers 501 may cover the upper portions of the middle segments 403M. The interfaces IF01 between the second mask layer 303 and the protection layers 501 may be tapered. The interfaces IF03 between the protection layers 501 and the barrier layer 405 may be substantially vertical.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

Figure 7:
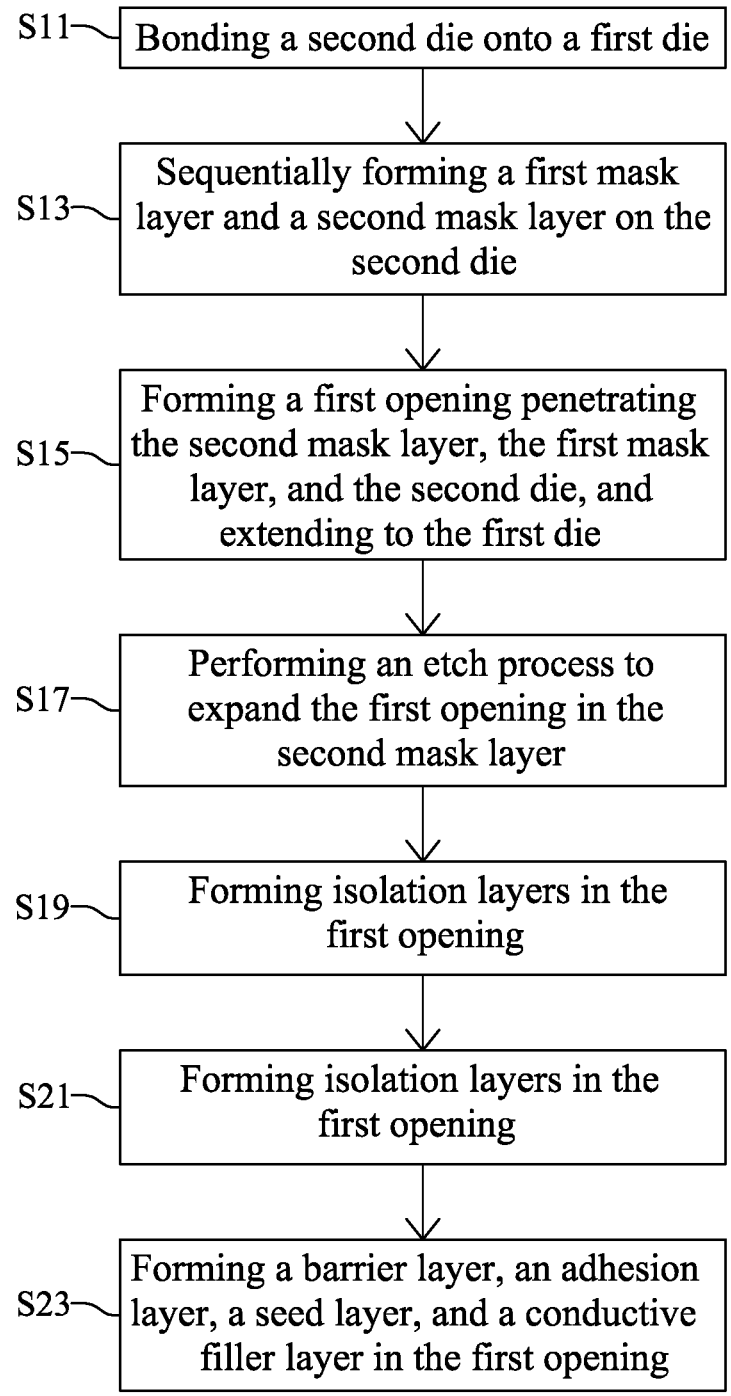
FIG. 7 illustrates, in a flowchart diagram form, a method for fabricating a semiconductor device in accordance with one embodiment of the present disclosure.

FIG. 7 illustrates, in a flowchart diagram form, a method 10 for fabricating a semiconductor device 1A in accordance with one embodiment of the present disclosure. FIGS. 8 to 21 illustrate, in schematic cross-sectional view diagrams, a flow for fabricating the semiconductor device 1A in accordance with one embodiment of the present disclosure.

With reference to FIGS. 7 to 10, at step S11, a second die 200 may be bonded onto a first die 100.

Figure 8:
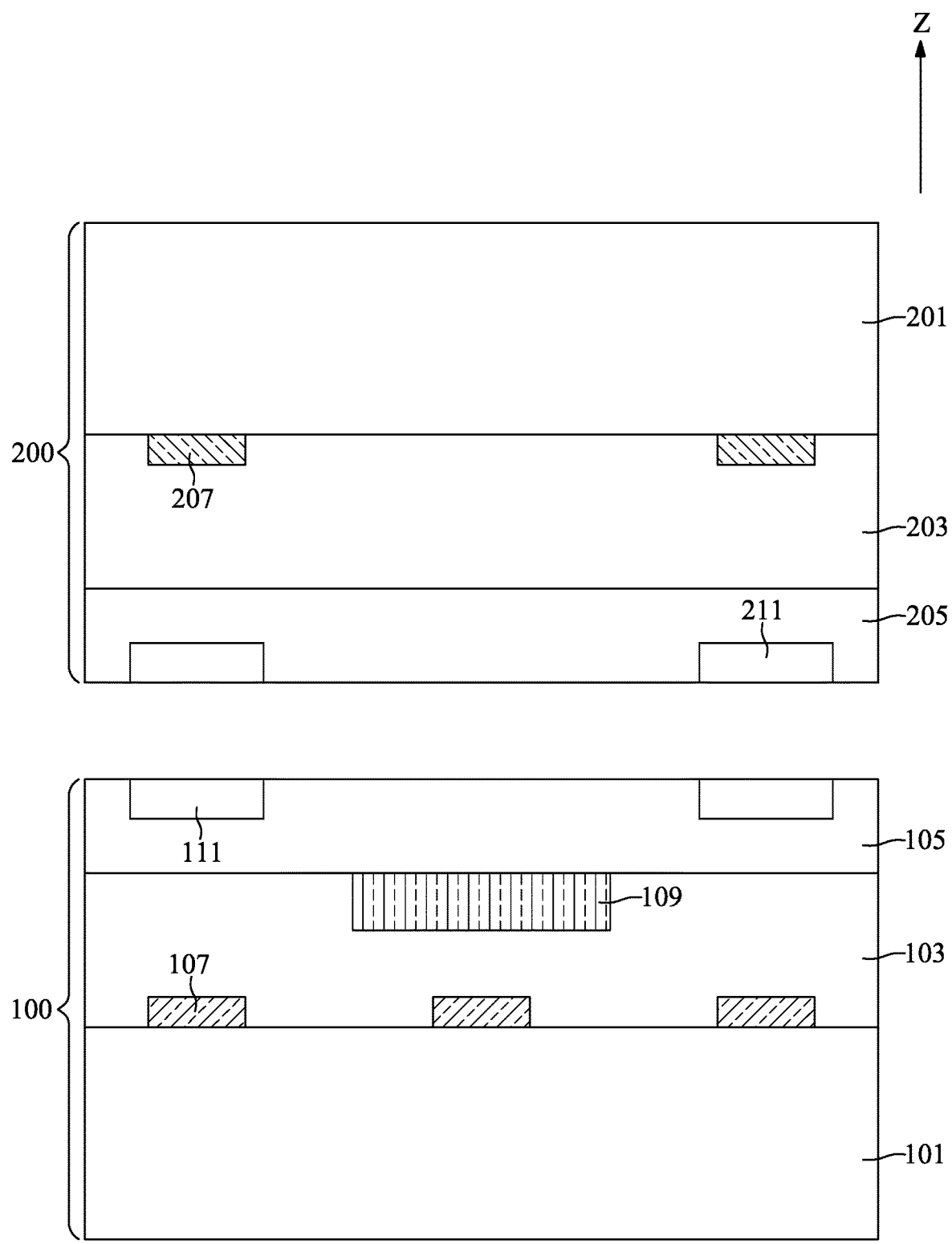
FIGS. 8 to 21 illustrate, in schematic cross-sectional view diagrams, a flow for fabricating the semiconductor device in accordance with one embodiment of the present disclosure.
Figure 9:
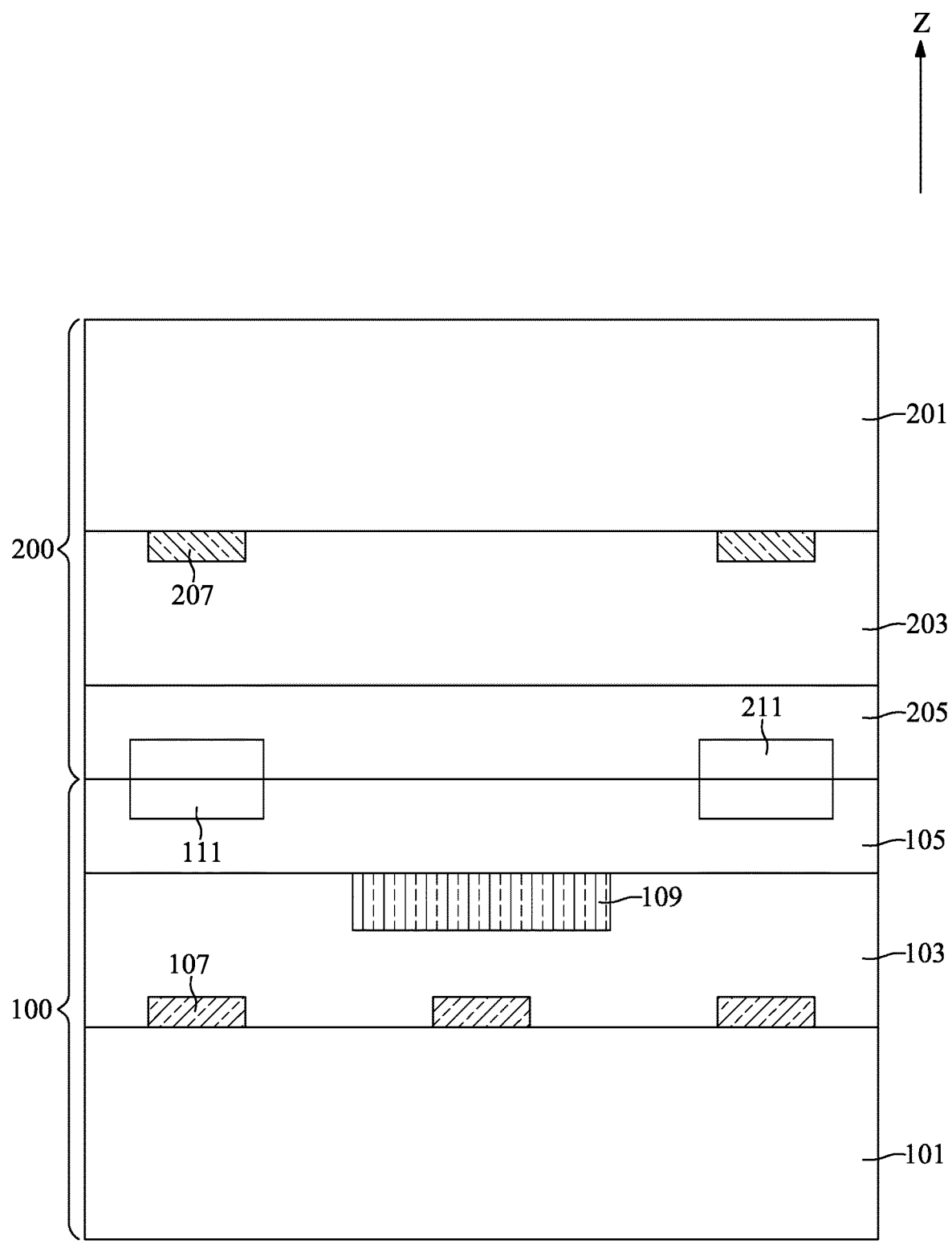

With reference to FIGS. 8 and 9, a first die 100 and a second die 200 may be separately provided. The first die 100 may include a first substrate 101, a first dielectric layer 103, a first passivation layer 105, first device elements 107, a first conductive feature 109, and first dummy conductive features 111. The first dielectric layer 103 may be formed on the first substrate 101. The first device elements 107 and the first conductive feature 109 may be formed in the first dielectric layer 103. The first passivation layer 105 may be formed on the first device elements 107. The first dummy conductive features 111 may be formed in the first passivation layer 105. The second die 200 may have a similar structure with the first die 100 but in an up-side down manner. The second die 200 may be bonded onto the first die 100 through a bonding process. The bonding process may include a thermal treatment performed to achieve a hybrid bonding between elements of the second die 200 and the first die 100. The hybrid bonding may include a dielectric-to-dielectric bonding and a metal-to-metal bonding. The dielectric-to-dielectric bonding may originate from the bonding between a second passivation layer 205 of the second die 200 and the first passivation layer 105 of the first die 100. The metal-to-metal bonding may originate from the bonding between the first dummy conductive features 111 of the first die 100 and second dummy conductive features 211 of the second die 200. A temperature of the bonding process may be between about 300° C. and about 450° C.

Figure 10:
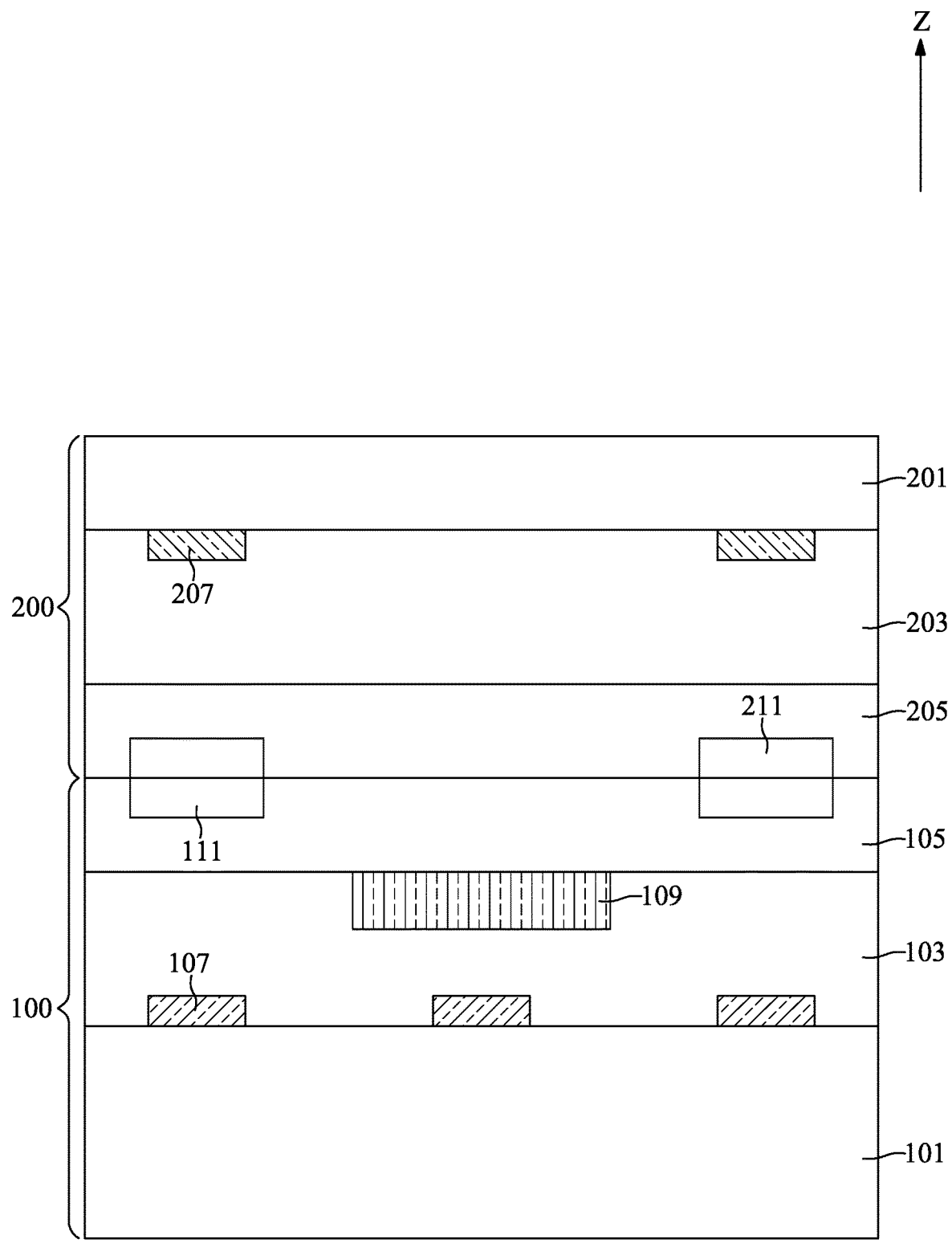

With reference to FIG. 10, a thinning process may be performed on a second substrate 201 of the second die 200 using an etching process, a chemical polishing process, or a grinding process to reduce a thickness of the second substrate 201.

Figure 11:
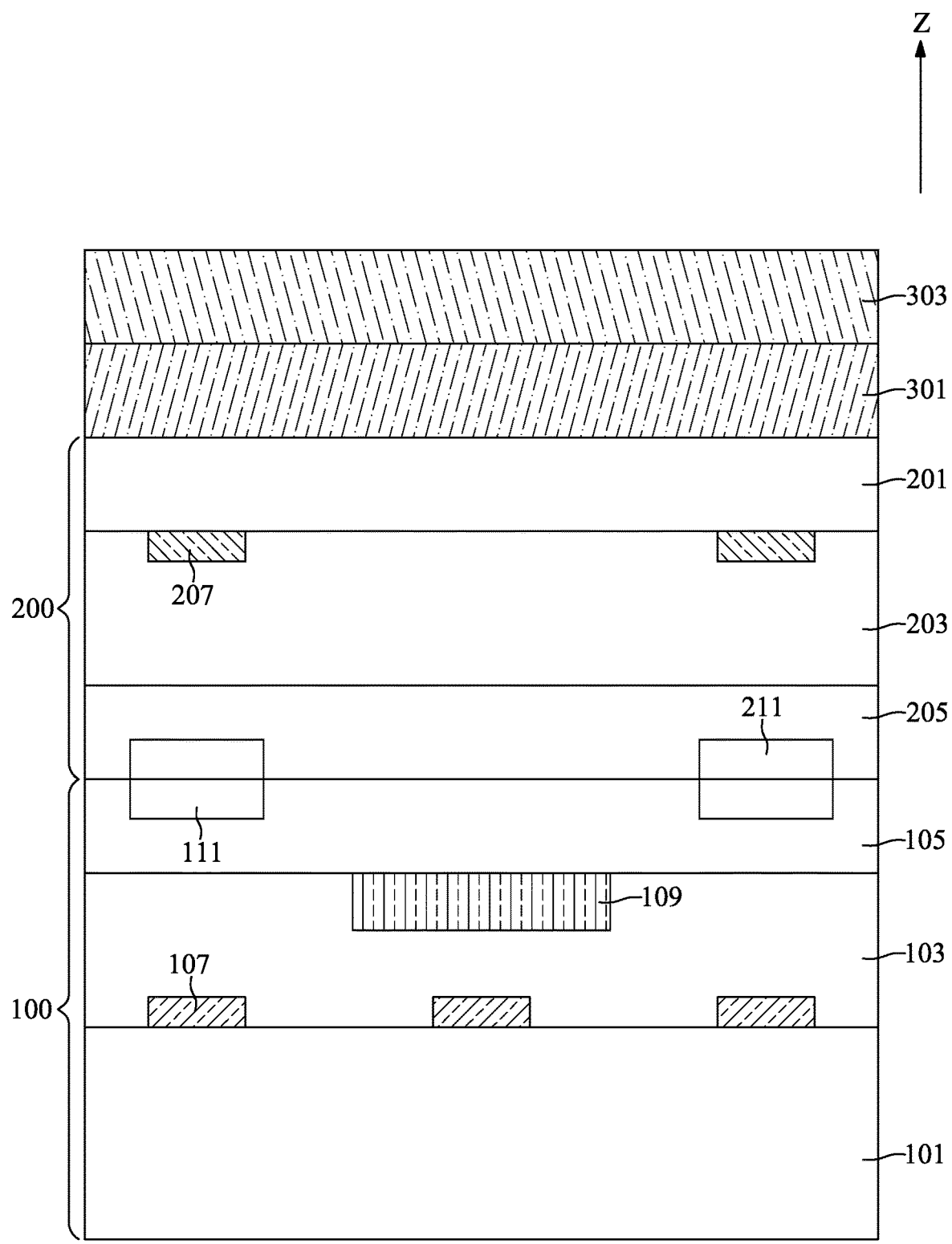

With reference to FIGS. 7 and 11, at step S13, a first mask layer 301 and a second mask layer 303 may be sequentially formed on the second die 200.

With reference to FIG. 11, the second mask layer 303 may be formed of a material having a higher etch rate comparing to the first mask layer 301. The different etch rates of the first mask layer 301 and the second mask layer 303 may be achieved by using different precursors, adjusting the amounts of precursors, and controlling deposition rate of precursors used in the deposition processes of the first mask layer 301 and the second mask layer 303. The precursors of the deposition processes of the first mask layer 301 and the second mask layer 303 may include silane, trimethylsilane, phenylsilane, nitrous oxide, nitrogen gas, ammonia, hydrazine, or combination thereof.

Figure 12:
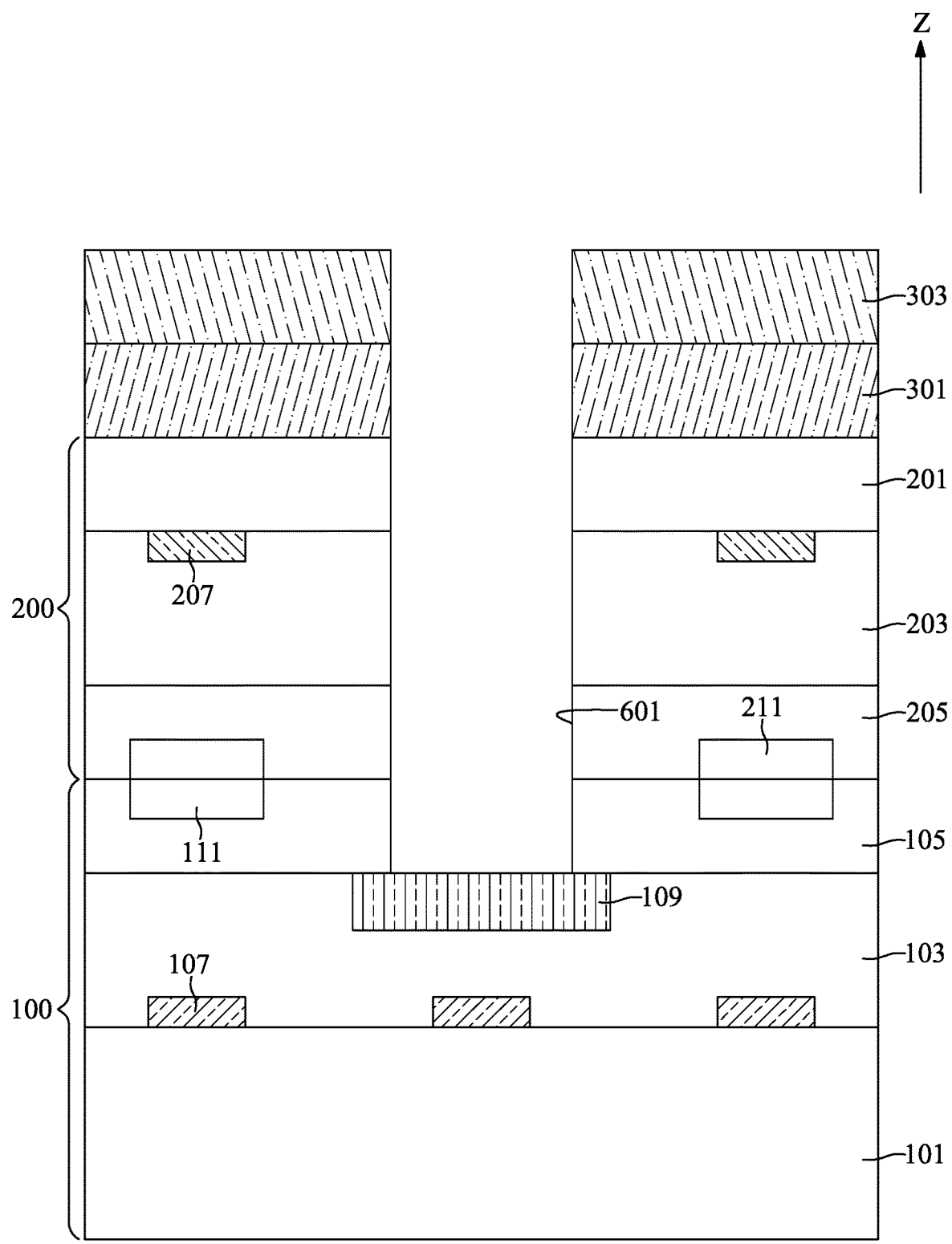

With reference to FIGS. 7 and 12, at step S15, a first opening 601 may be formed penetrating the second mask layer 303, the first mask layer 301, and the second die 200, and extending to the first die 100.

With reference to FIG. 12, the first opening 601 may be formed by performing a photolithography process and multiple etch processes to sequentially remove the second mask layer 303, the first mask layer 301, the second die 200, the first passivation layer 105, and the first dielectric layer 103. The first conductive feature 109 may be exposed through the first opening 601.

Figure 13:
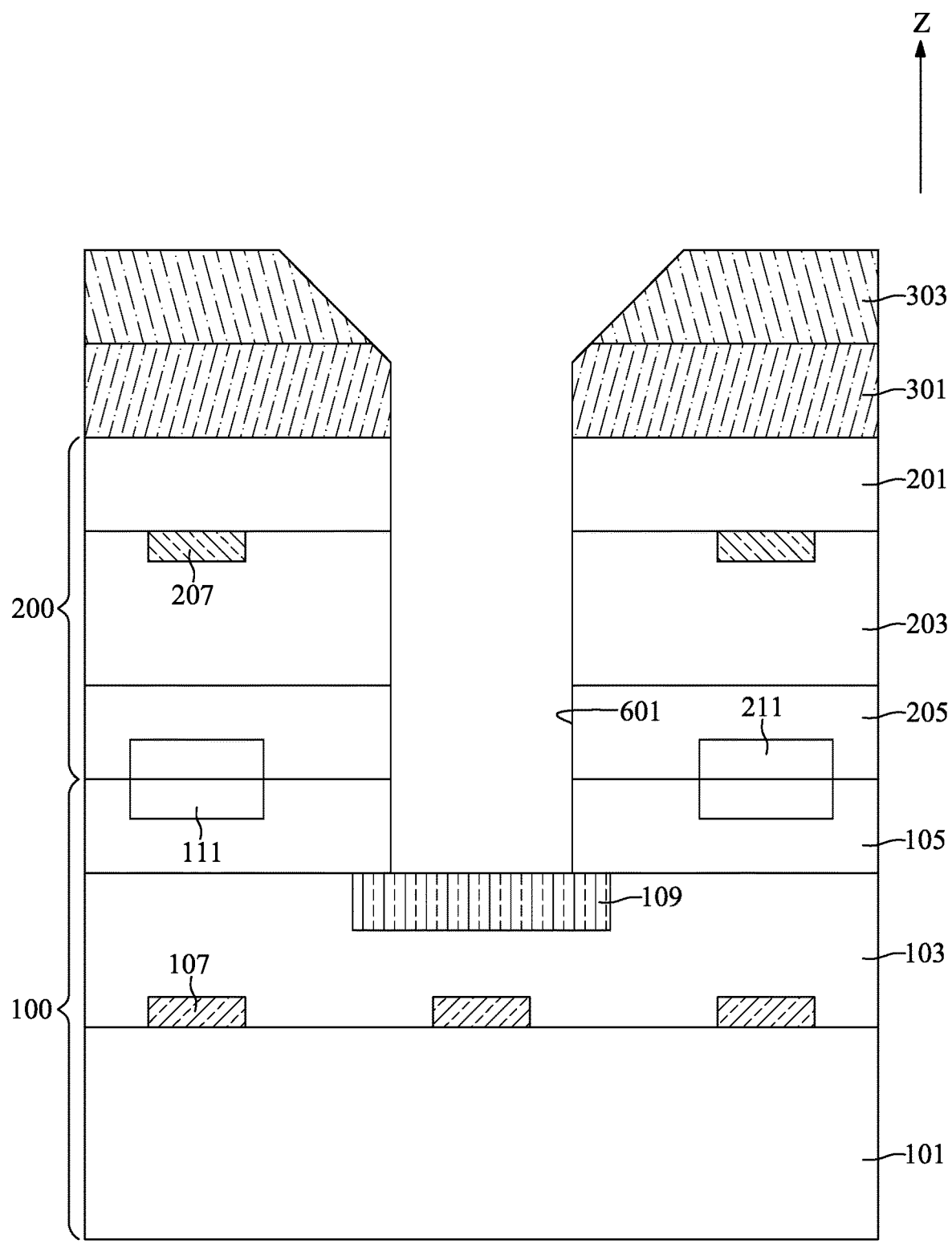

With reference to FIGS. 7 and 13, at step S17, an etch process may be performed to expand the first opening 601 in the second mask layer 303.

With reference to FIG. 13, an etch rate ratio of the second mask layer 303 to the first mask layer 301 may be between about 100:1 and about 1.05:1. In some embodiments, the etch process may be a wet etch process using a wet etch solution. The wet etch solution may be a hydrofluoride solution having 6:1 buffer oxide etchant and including 7% w/w hydrofluoric acid, 34% w/w ammonium fluoride, and 59% w/w water. In some embodiments, the etch process may be a dry etch process using gas selected from the group consisting of $CH_2F_2$, $CHF_3$, and $C_4F_8$. After the etch process, the width of the first opening 601 in the second mask layer 303 may be broaden and the width of the first opening 601 in the first mask layer 301 may be unchanged. In other words, the sidewalls of the first opening 601 in the second mask layer 303 may be tapered after the etch process. The broaden first opening 601 in the second mask layer 303 may facilitate the formation of the protection layers 501 which will be illustrated later.

Figure 14:
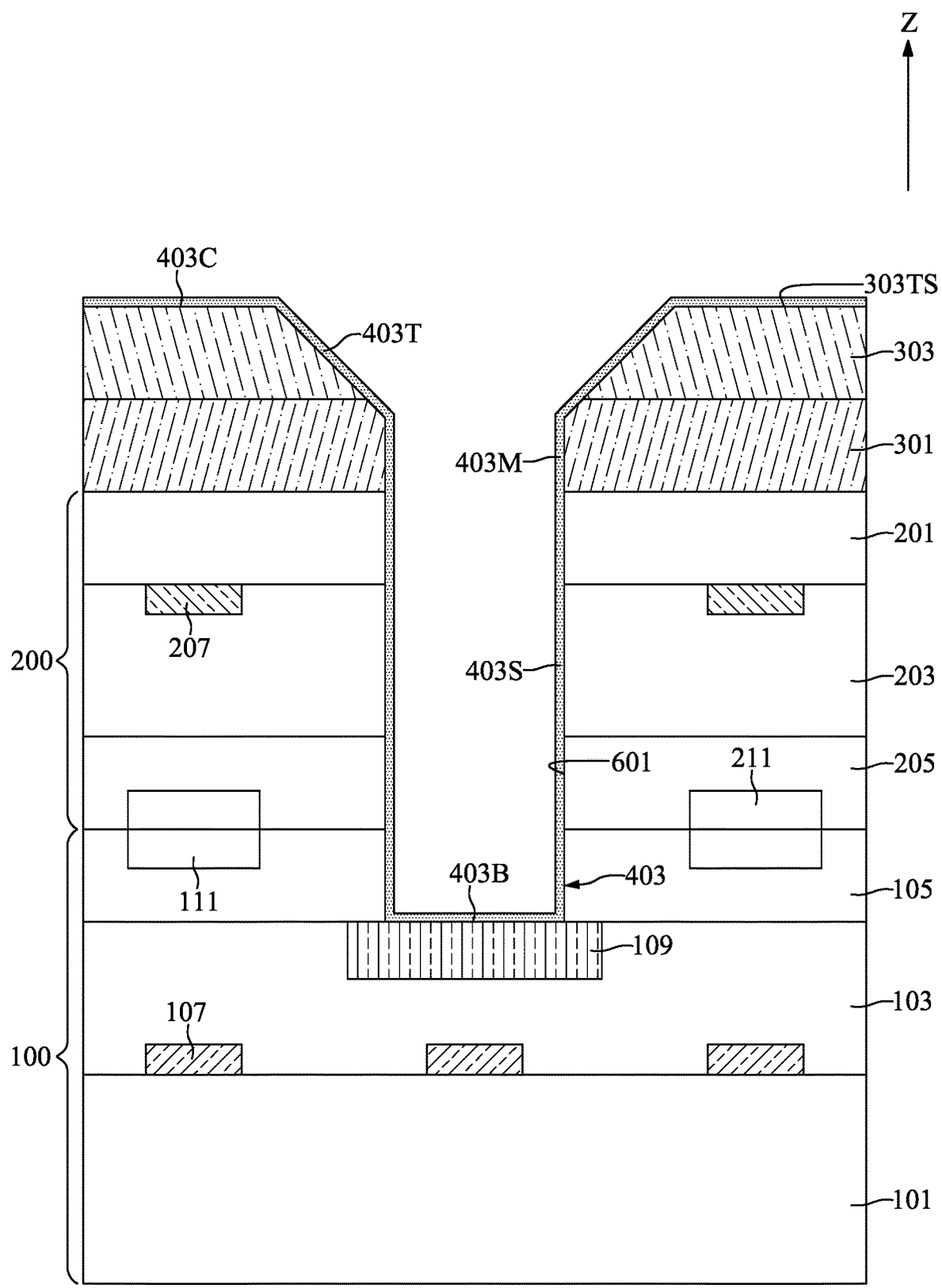
Figure 15:
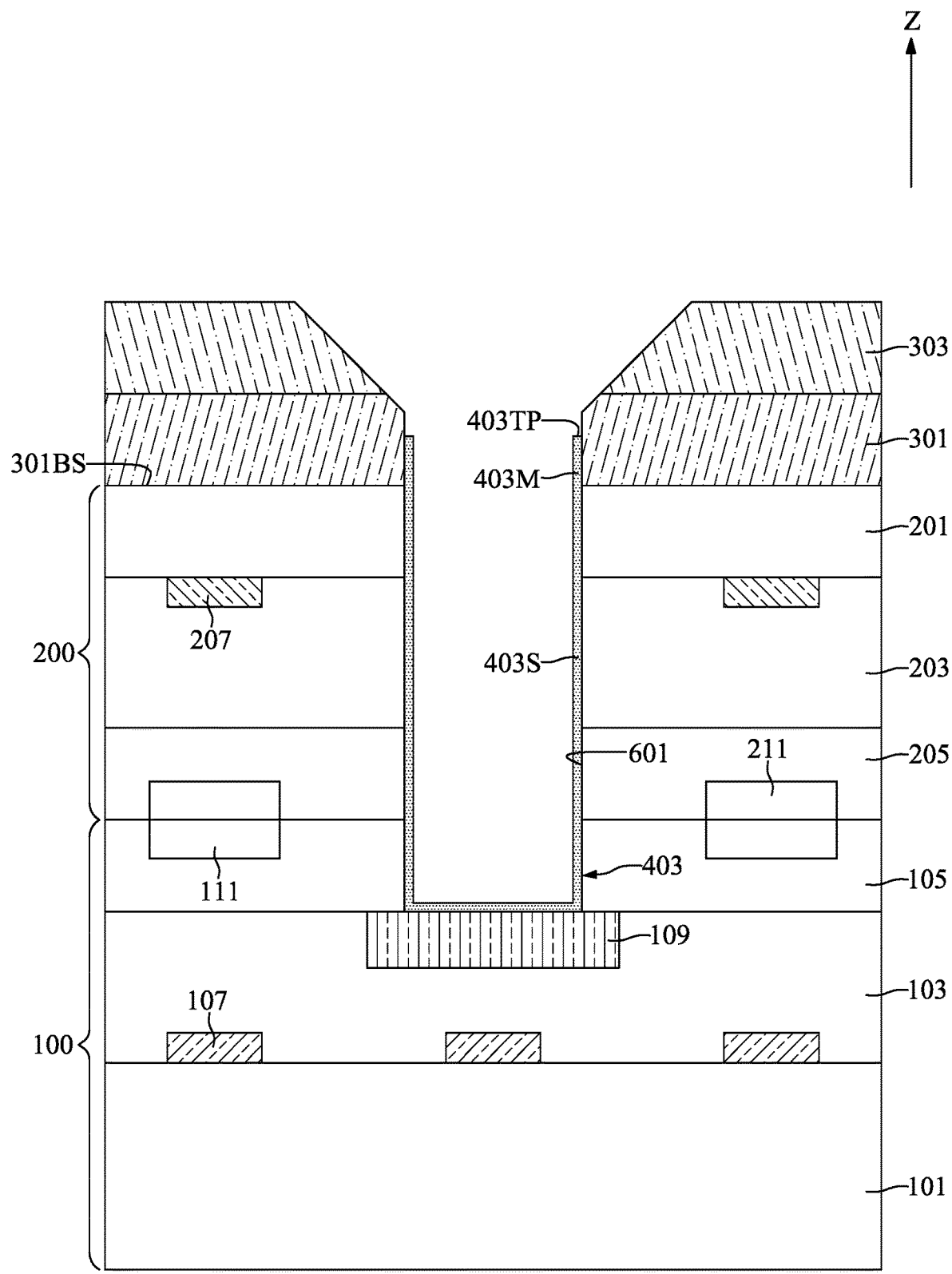

With reference to FIGS. 7, 14, and 15, at step S19, isolation layers 403 may be formed in the first opening 601.

With reference to FIG. 14, an isolation layer 403 may be deposit in the first opening 601 and on the top surface 303TS of the second mask layer 303. The portion of the isolation layer 403 formed on the first conductive feature 109 may be referred to as the bottom segment 403B. The portion of the isolation layer 403 formed below the bottom surface 301BS of the first mask layer 301 and on the sidewalls of the first opening 601 may be referred to as the side segments 403S. The portion of the isolation layer 403 formed above the bottom surface 301BS of the first mask layer 301 and below the bottom surface 303BS of the second mask layer 303 may be referred to as the middle segments 403M. The portion of the isolation layer 403 formed above the bottom surface 303BS of the second mask layer 303 and below the top surface 303TS of the second mask layer 303 may be referred to as the top segments 403T. The portion of the isolation layer 403 formed on the top surface 303TS of the second mask layer 303 may be referred to as the covering segments 403C.

With reference to FIG. 15, a punch etch process may be performed to remove the bottom segment 403B, the covering segments 403C, the top segments 403T, and portions of the middle segments 403M. The isolation layer 403 may be divided into multiple portions after the punch etch process. The topmost points 403TP of the isolation layers 403 may be at a vertical above the bottom surface 301BS of the first mask layer 301. The etch rate of the isolation layers 403 of the punch etch process may be faster than the etch rate of the second mask layer 303 of the punch etch process and the etch rate of the first mask layer 301 of the punch etch process to avoid the silicon/hard mask layer interface damage.

In some embodiments, the punch etch process may over recess the isolation layer 403. The topmost points 403TP of the isolation layers 403 may be at a vertical below the bottom surface 301BS of the first mask layer 301. In this situation, a metal to silicon leakage may occur during the subsequent formation of a conductive filler layer 401.

Figure 16:
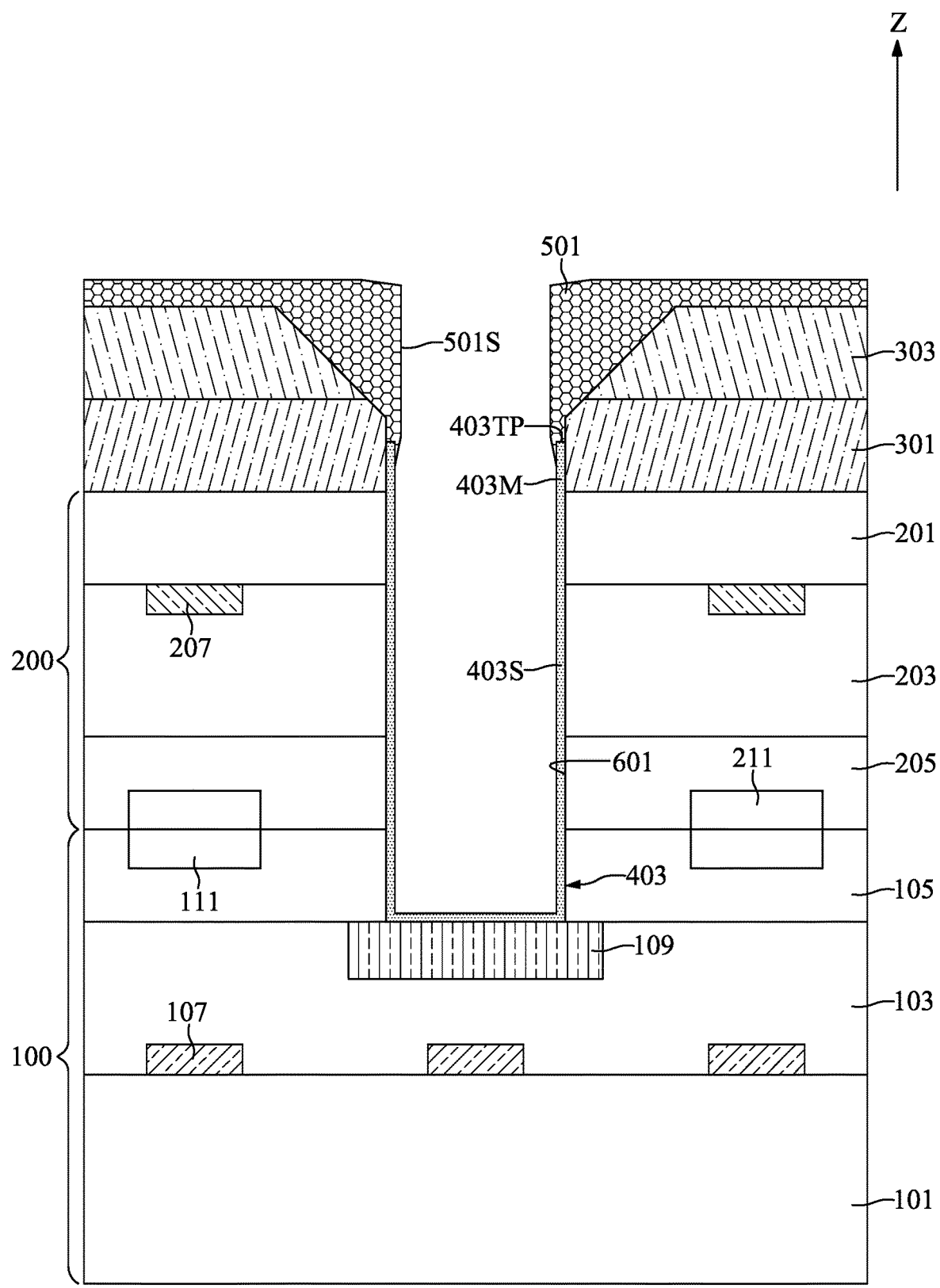

With reference to FIGS. 7 and 16, at step S21, protection layers 501 may be formed to cover upper portions of the isolation layers 403.

With reference to FIG. 16, the protection layers 501 may be formed by a deposition process such as an atomic layer deposition method precisely controlling an amount of a first precursor of the atomic layer deposition method. The protection layers 501 may be formed of, for example, aluminum oxide, hafnium oxide, zirconium oxide, titanium oxide, titanium nitride, tungsten nitride, silicon nitride, or silicon oxide.

In some embodiments, when the protection layers 501 are formed of aluminum oxide, the first precursor of the atomic layer deposition method may be trimethylaluminum and a second precursor of the atomic layer deposition method may be water or ozone.

In some embodiments, when the protection layers 501 are formed of hafnium oxide, the first precursor of the atomic layer deposition method may be hafnium tetrachloride, hafnium tert-butoxide, hafnium dimethylamide, hafnium ethylmethylamide, hafnium diethylamide, or hafnium methoxy-t-butoxide and the second precursor of the atomic layer deposition method may be water or ozone.

In some embodiments, when the protection layers 501 are formed of zirconium oxide, the first precursor of the atomic layer deposition method may be zirconium tetrachloride and the second precursor of the atomic layer deposition method may be water or ozone.

In some embodiments, when the protection layers 501 are formed of titanium oxide, the first precursor of the atomic layer deposition method may be titanium tetrachloride, tetraethyl titanate, or titanium isopropoxide and the second precursor of the atomic layer deposition method may be water or ozone.

In some embodiments, when the protection layers 501 are formed of titanium nitride, the first precursor of the atomic layer deposition method may be titanium tetrachloride and ammonia.

In some embodiments, when the protection layers 501 are formed of tungsten nitride, the first precursor of the atomic layer deposition method may be tungsten hexafluoride and ammonia.

In some embodiments, when the protection layers 501 are formed of silicon nitride, the first precursor of the atomic layer deposition method may be silylene, chlorine, ammonia, and/or dinitrogen tetrahydride.

In some embodiments, when the protection layers 501 are formed of silicon oxide, the first precursor of the atomic layer deposition method may be silicon tetraisocyanate or $CH_3OSi(NCO)_3$ and the second precursor of the atomic layer deposition method may be hydrogen or ozone.

Due to the tapered sidewalls of the first opening 601 in the second mask layer 303, the sidewalls 501S of the protection layers 501 may be substantially vertical. The protection layers 501 may provide additional protection to the second mask layer 303, the first mask layer 301, and the second die 200 during the subsequent semiconductor processes. Hence, the metal to silicon leakage while the formation of the conductive filler layer 401 may be avoided. As a result, the performance/yield of the semiconductor device 1A may be improved.

With reference to FIG. 7 and FIGS. 17 to 21, at step S23, a barrier layer 405, an adhesion layer 407, a seed layer 409, and a conductive filler layer 401 may be formed in the first opening 601.

Figure 17:
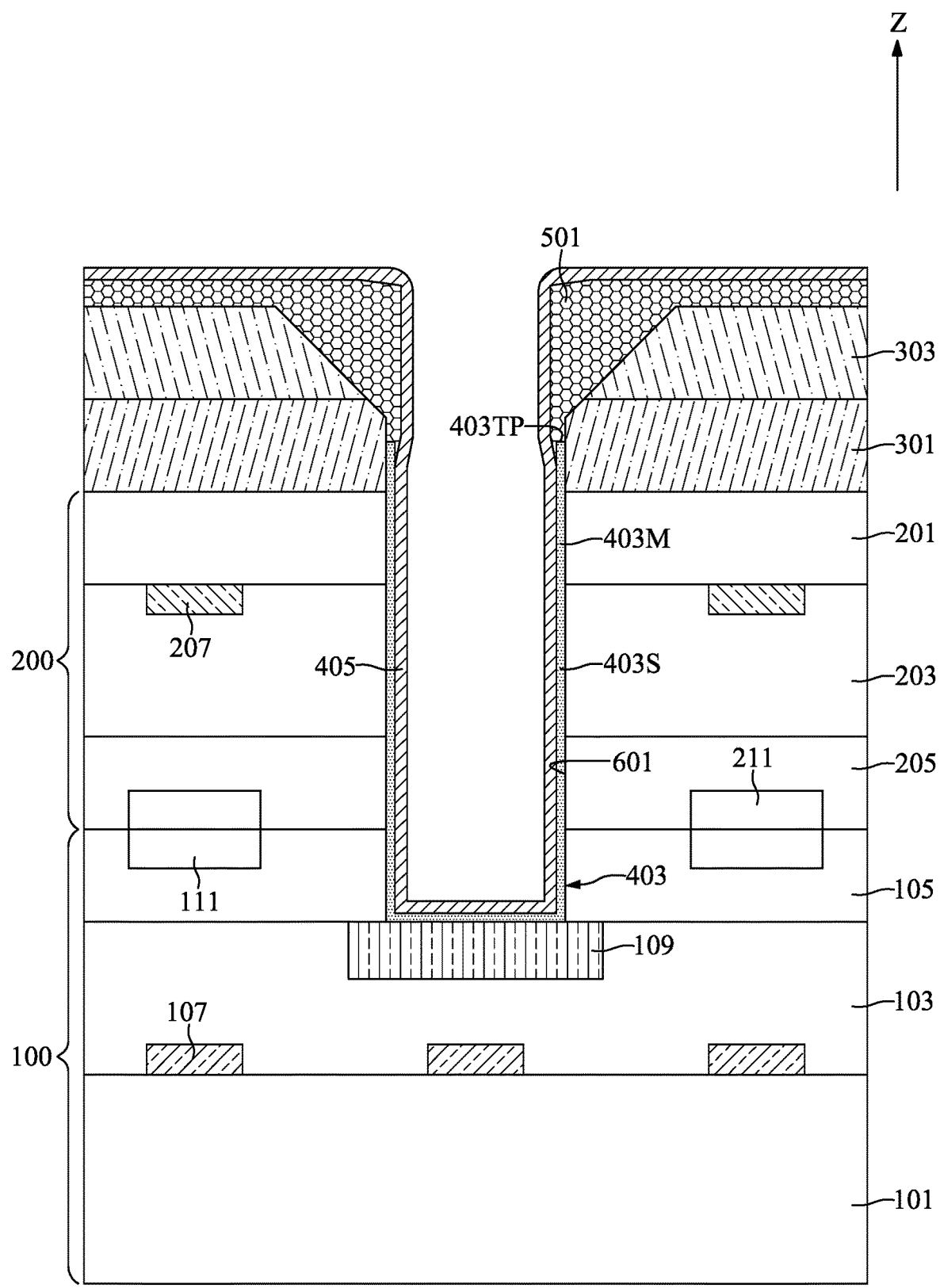

With reference to FIG. 17, the barrier layer 405 may be conformally formed on the protection layers 501 and in the first opening 601. The barrier layer 405 may cover the protection layers 501, the isolation layers 403, and the top surface of the first conductive feature 109.

Figure 18:
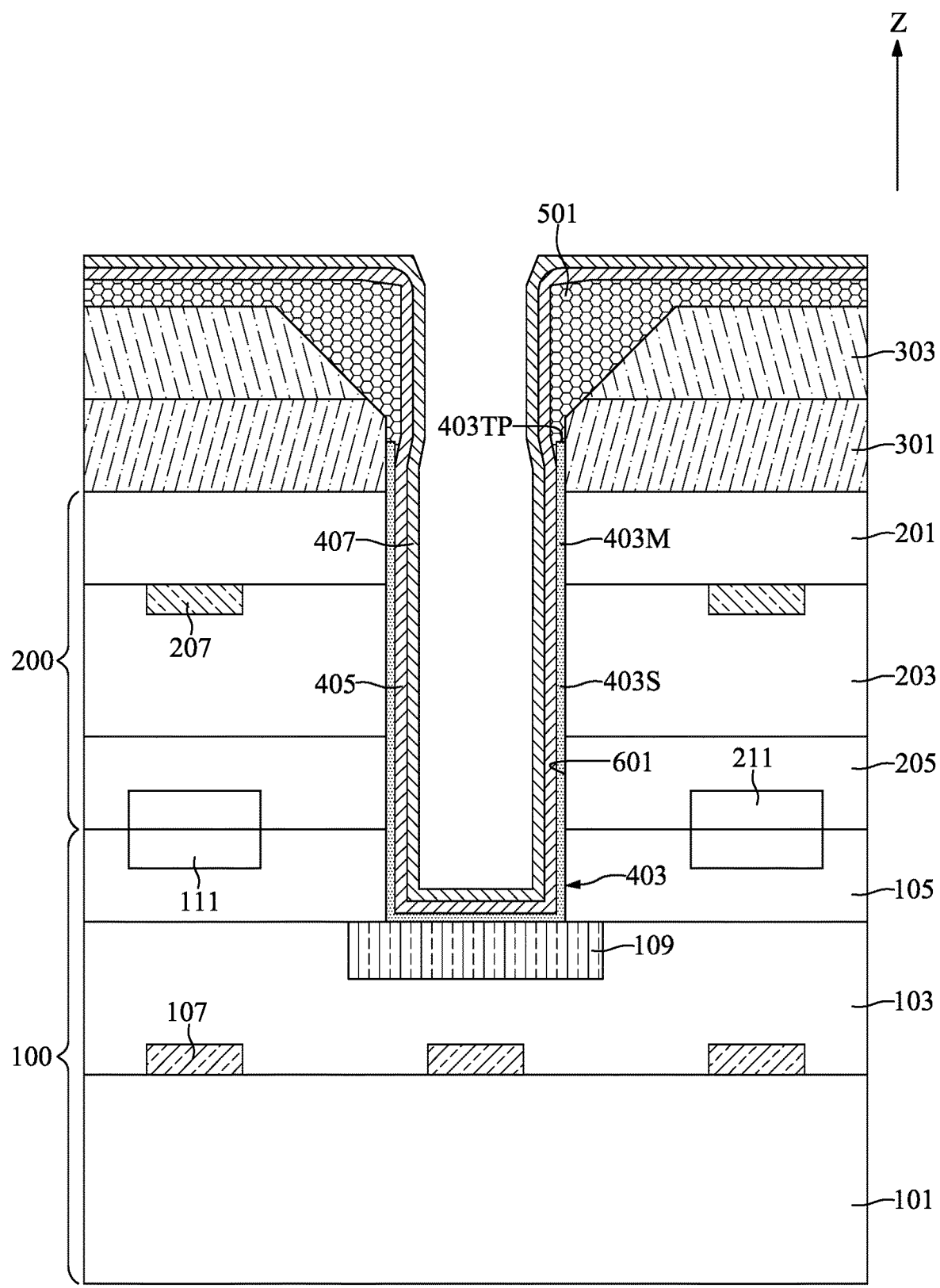
Figure 19:
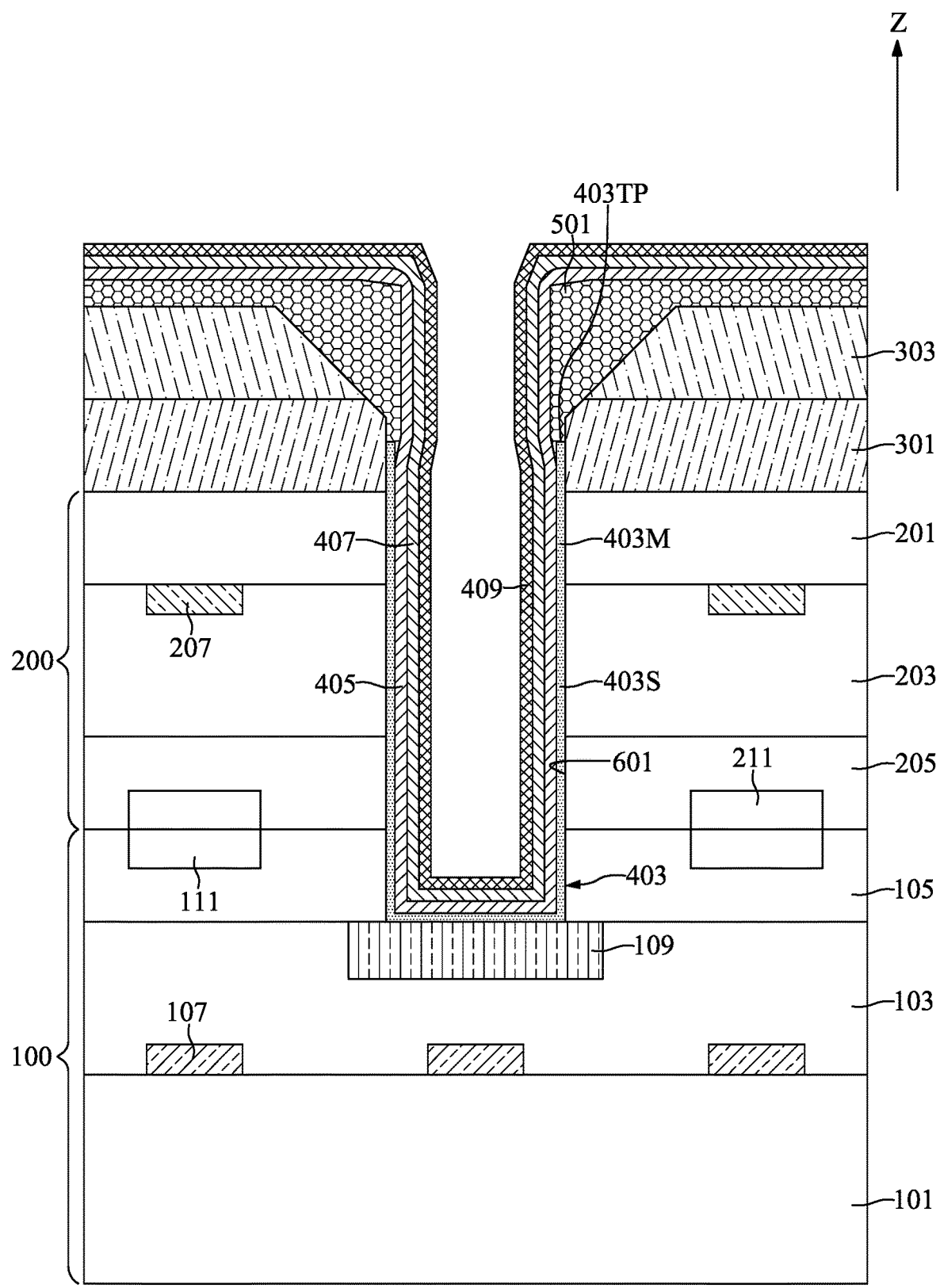

With reference to FIGS. 18 to 19, the adhesion layer 407 may be conformally formed on the barrier layer 405. The seed layer 409 may be conformally formed on the adhesion layer 407.

Figure 20:
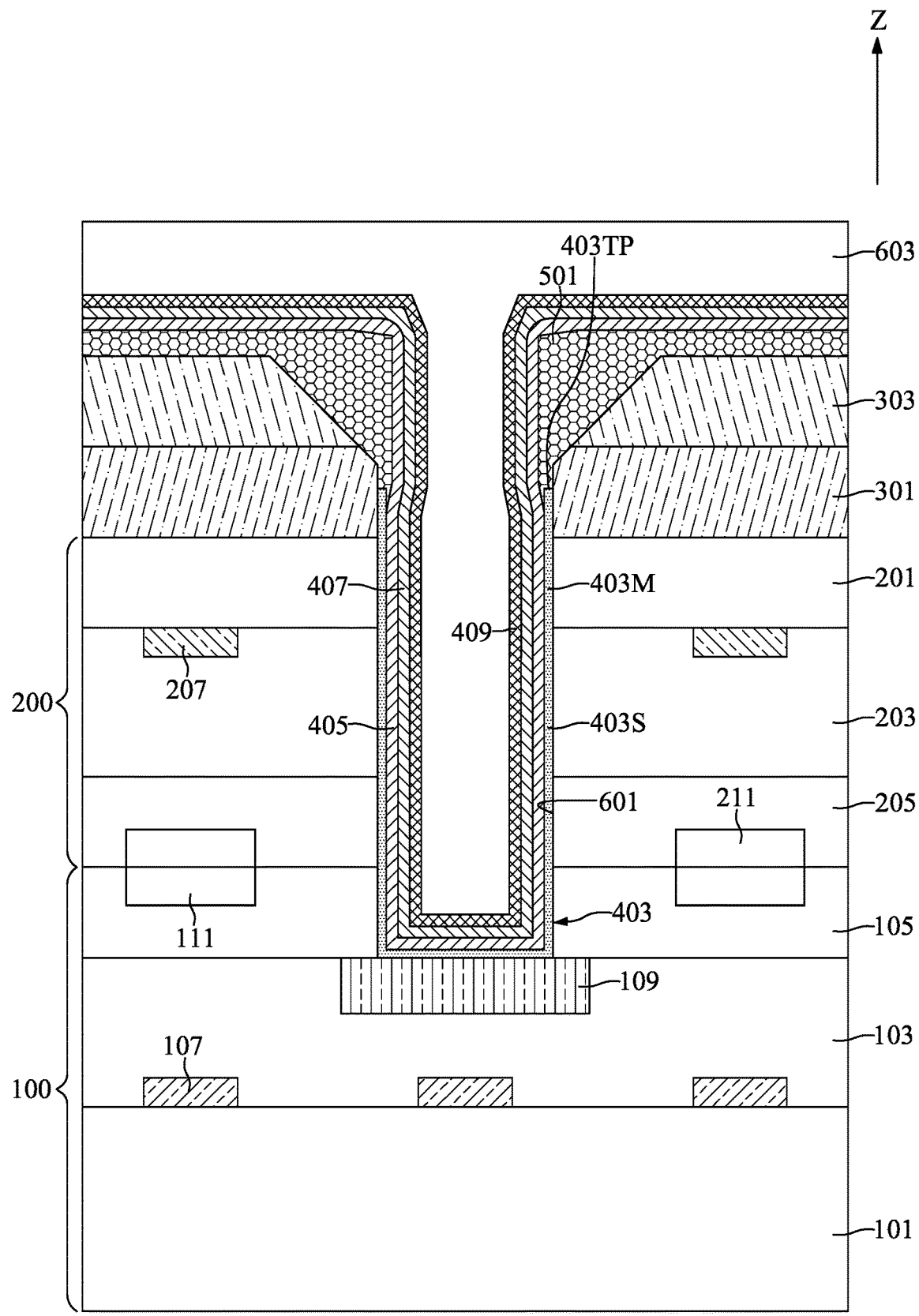

With reference to FIG. 20, a layer of first conductive material 603 may be deposited over the intermediate semiconductor device illustrated in FIG. 19 and completely fill the first opening 601. The layer of first conductive material 603 may be deposited by atomic layer deposition, chemical vapor deposition, or other conformal deposition method. Due to the presence of the protection layers 501, the deposition rate of the first conductive material 603 on the sidewalls of the first opening 601 may be reduced. Hence, the deposition rate of the first conductive material 603 on the sidewalls of the first opening 601 and the deposition rate of the first conductive material 603 on the bottom surfaces of the first opening 601 may become close to each other. As a result, the first opening 601 may be filled without any void formation near the bottom surfaces of the first opening 601. The yield of the semiconductor device 1A may be improved.

Figure 21:
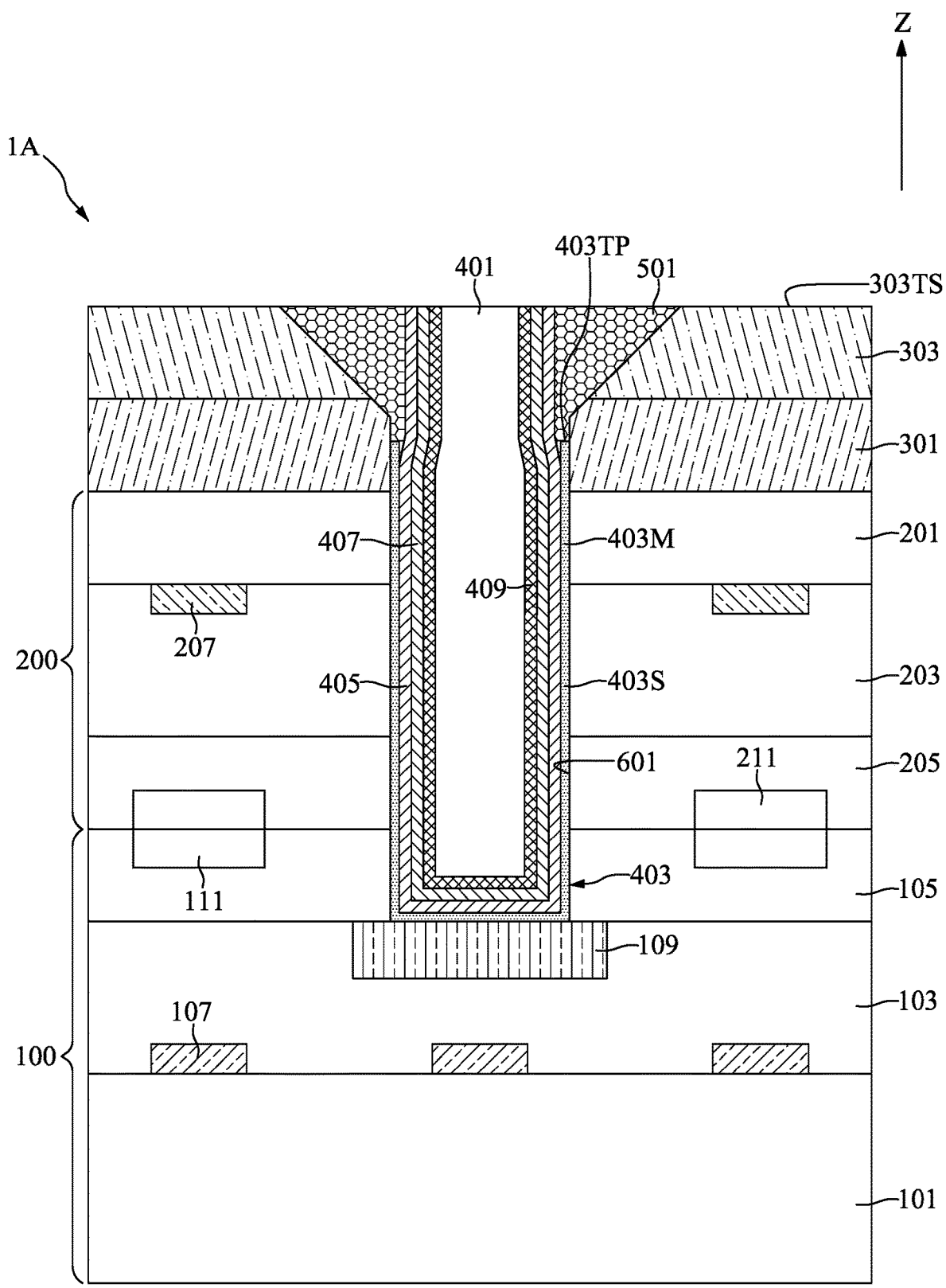

With reference to FIG. 21, a planarization process, such as chemical mechanical polishing, may be performed until the top surface 303TS of the second mask layer 303 is exposed to remove excess material, provide a substantially flat surface for subsequent processing steps, and concurrently form the conductive filler layer 401 in the first opening 601.

Figure 22:
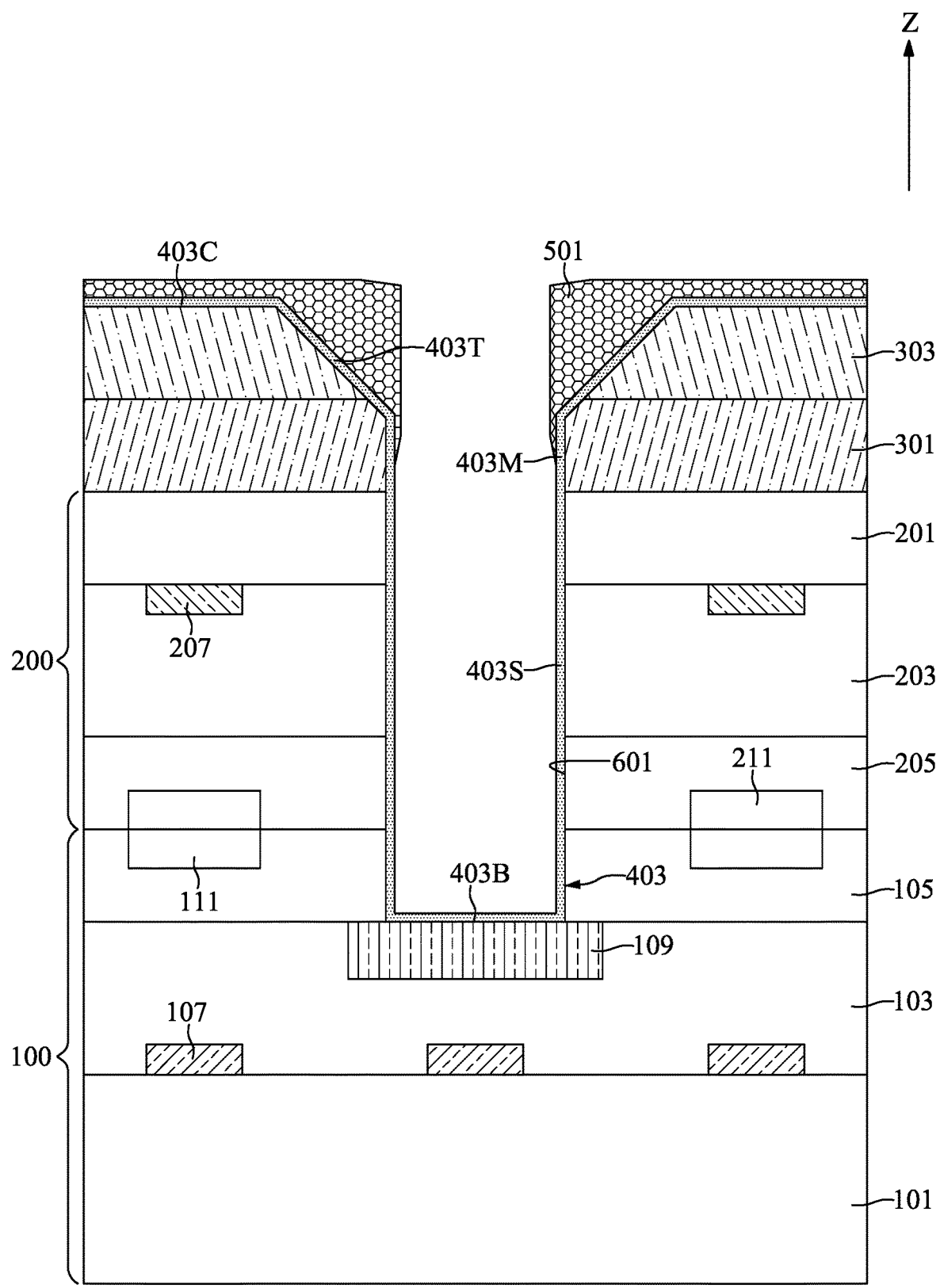
FIGS. 22 to 24 illustrate, in schematic cross-sectional view diagrams, a flow for fabricating a semiconductor device in accordance with another embodiment of the present disclosure.
Figure 23:
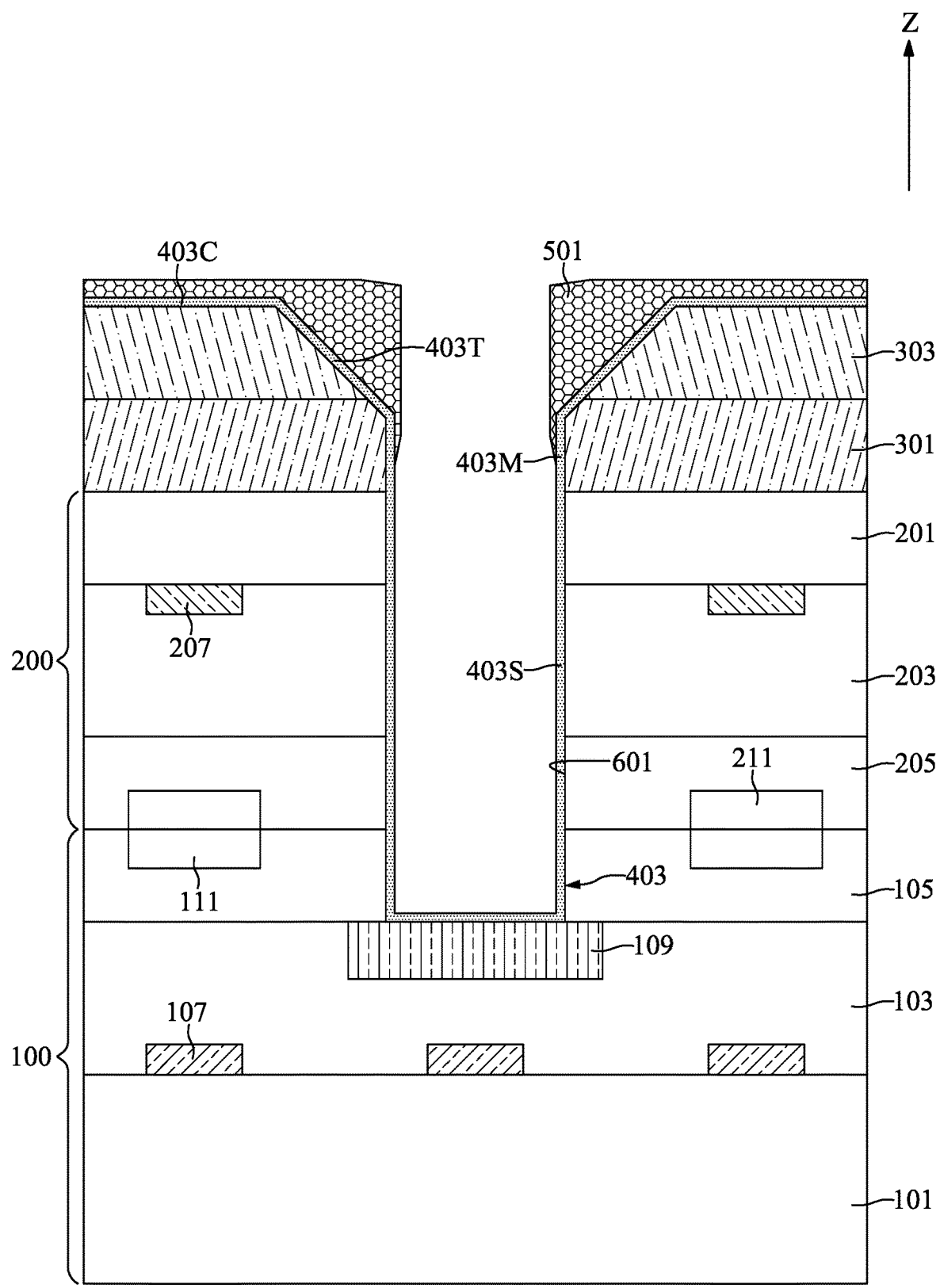
Figure 24:
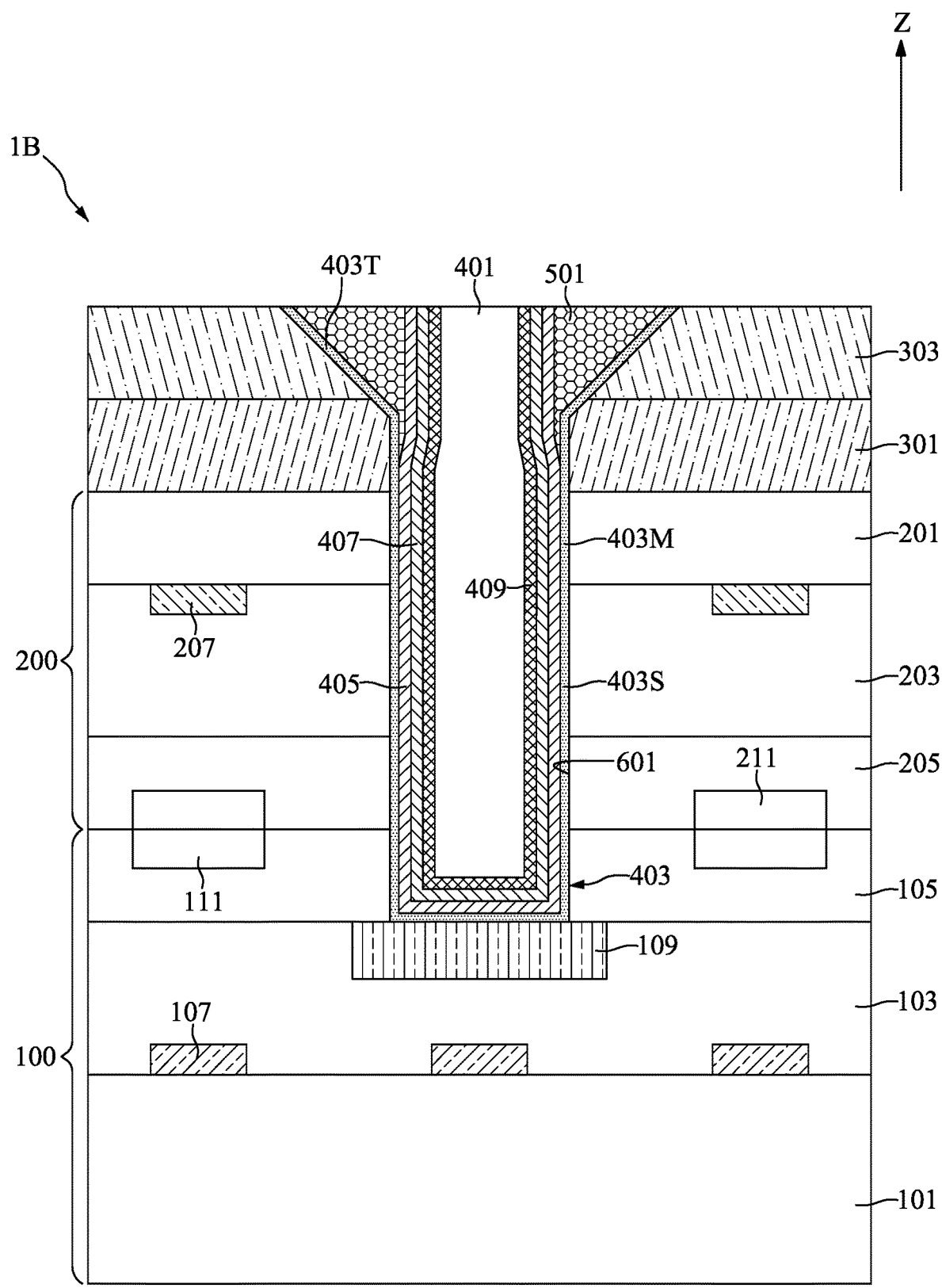

FIGS. 22 to 24 illustrate, in schematic cross-sectional view diagrams, a flow for fabricating a semiconductor device 1B in accordance with another embodiment of the present disclosure.

With reference to FIG. 22, an intermediate semiconductor device as illustrated in FIG. 14 may be fabricated. The protection layers 501 may be formed on isolation layer 403 without previously performing a punch etch process on the isolation layer 403. That is, the protection layers 501 may formed covering the covering segments 403C, the top segments 403T, and the upper portions of the middle segments 403M.

With reference to FIG. 23, after the formation of the protection layers 501, a punch etch process may be performed on the intermediate semiconductor device illustrated in FIG. 22. The bottom segment 403B may be removed. With the presence of the protection layers 501, over recessing of the isolation layer 403 during the punch etch process and the metal to silicon leakage during the formation of a conductive filler layer 401 may be avoided. With reference to FIG. 24, other elements may be formed with a procedure similar to that illustrated in FIGS. 17 to 21.

FIGS. 25 to 28 illustrate, in schematic cross-sectional view diagrams, a flow for fabricating a semiconductor device 1C in accordance with another embodiment of the present disclosure.

Figure 25:
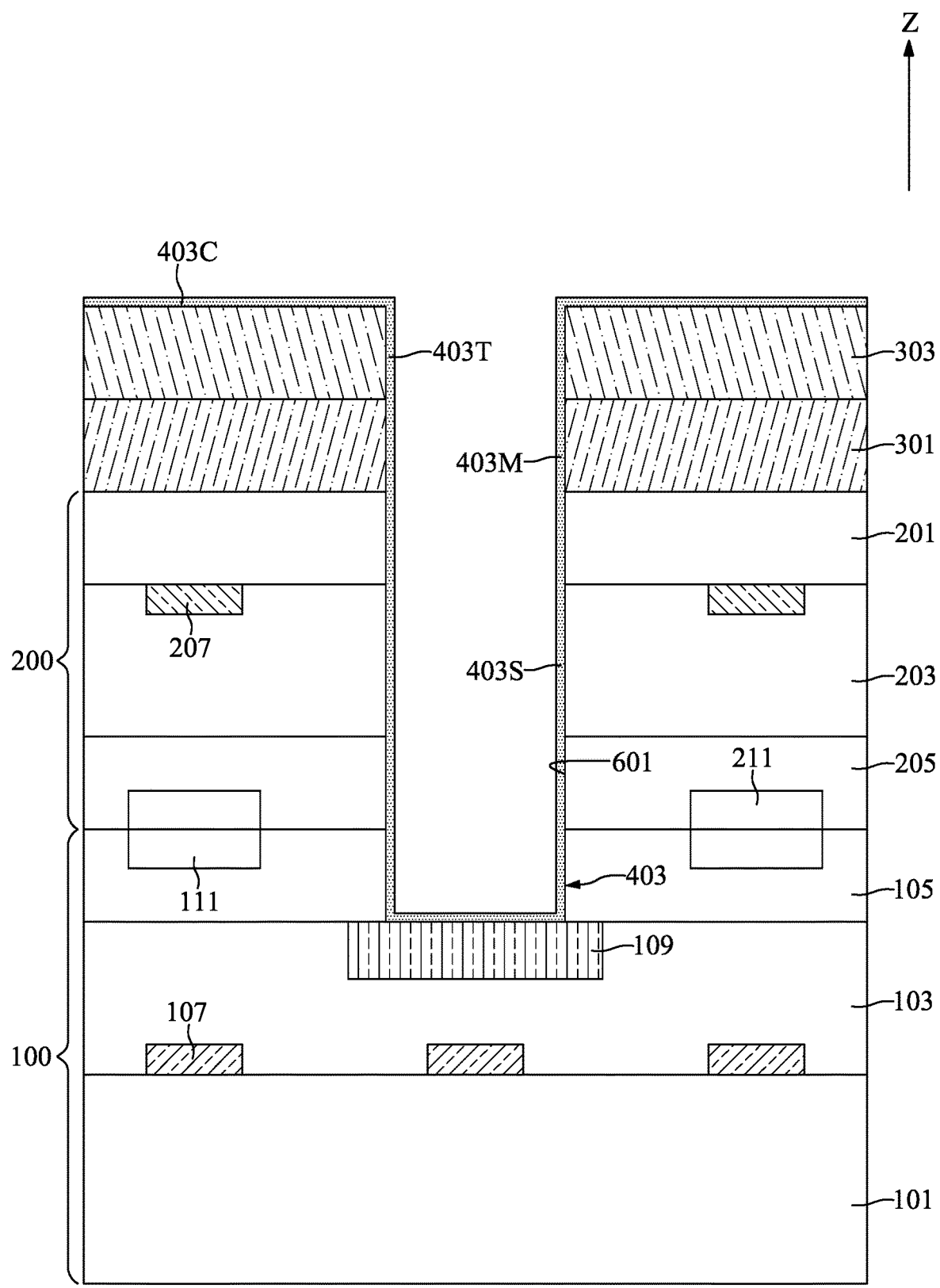
FIGS. 25 to 28 illustrate, in schematic cross-sectional view diagrams, a flow for fabricating a semiconductor device in accordance with another embodiment of the present disclosure.

With reference to FIG. 25, an intermediate semiconductor device as illustrated in FIG. 12 may be fabricated. The isolation layer 403 may be formed in the first opening 601 without previously expanding the first opening 601 in the second mask layer 303. The whole sidewalls of the first opening 601 may be substantially vertical.

Figure 26:
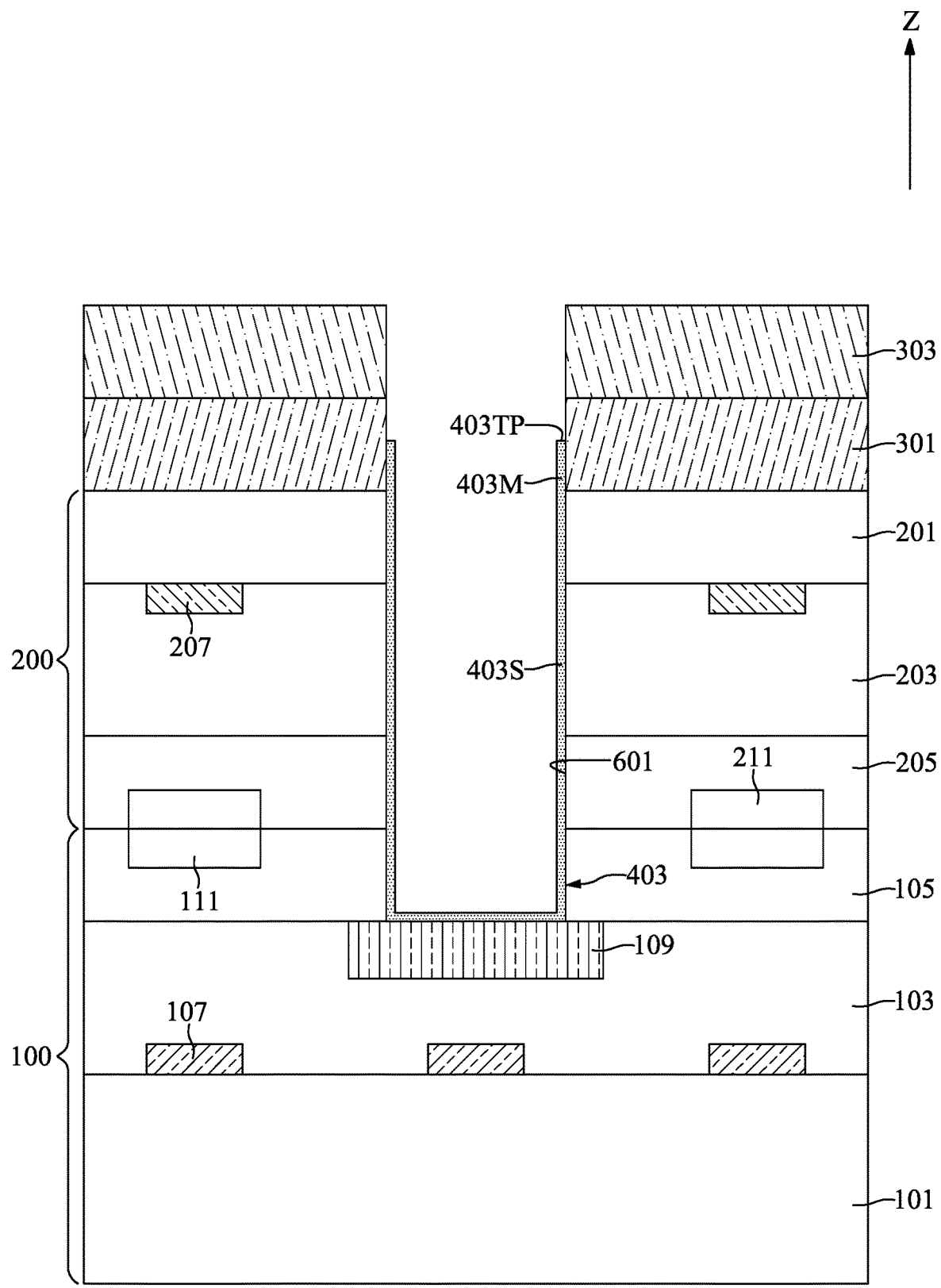
Figure 27:
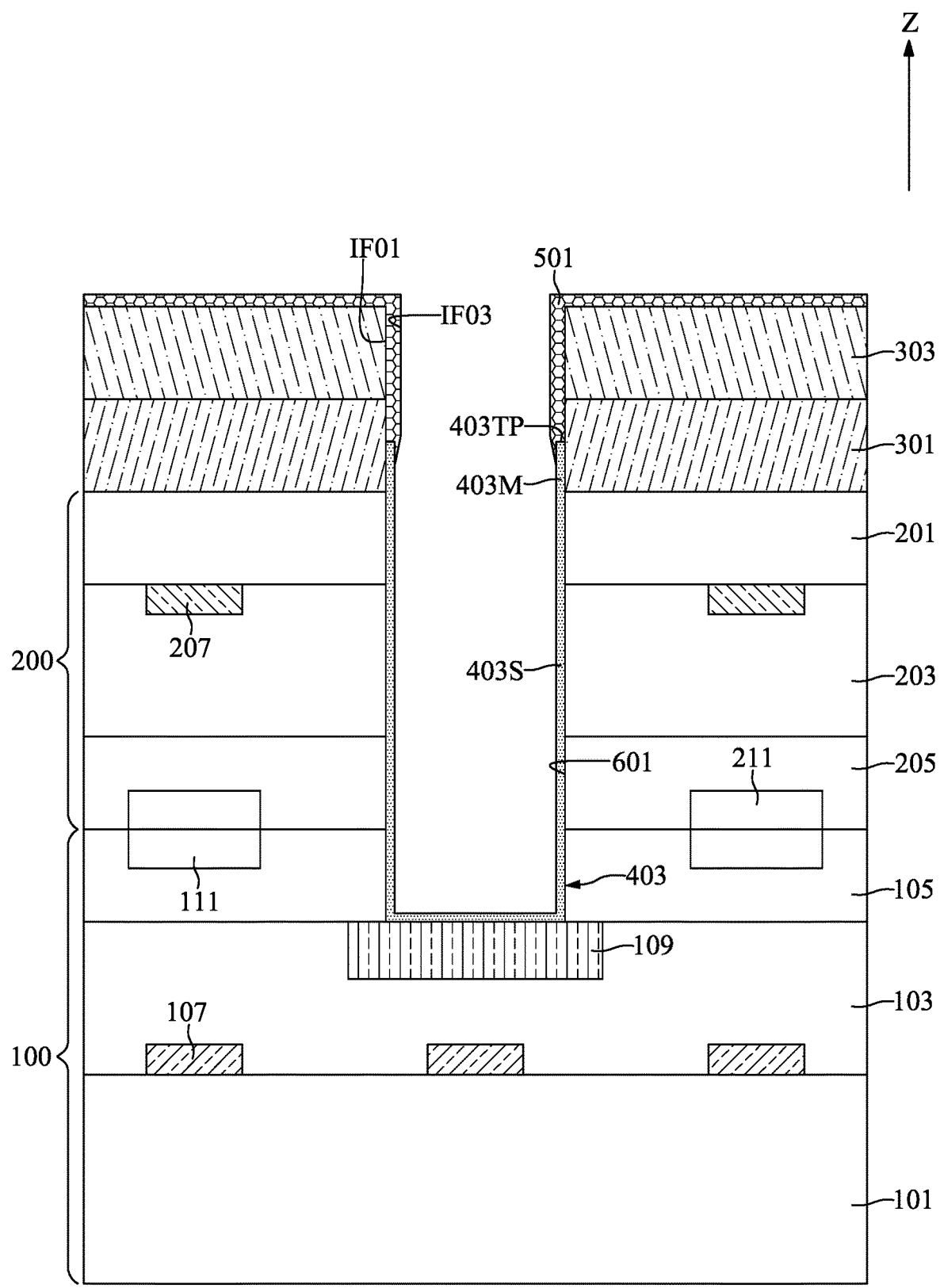
Figure 28:
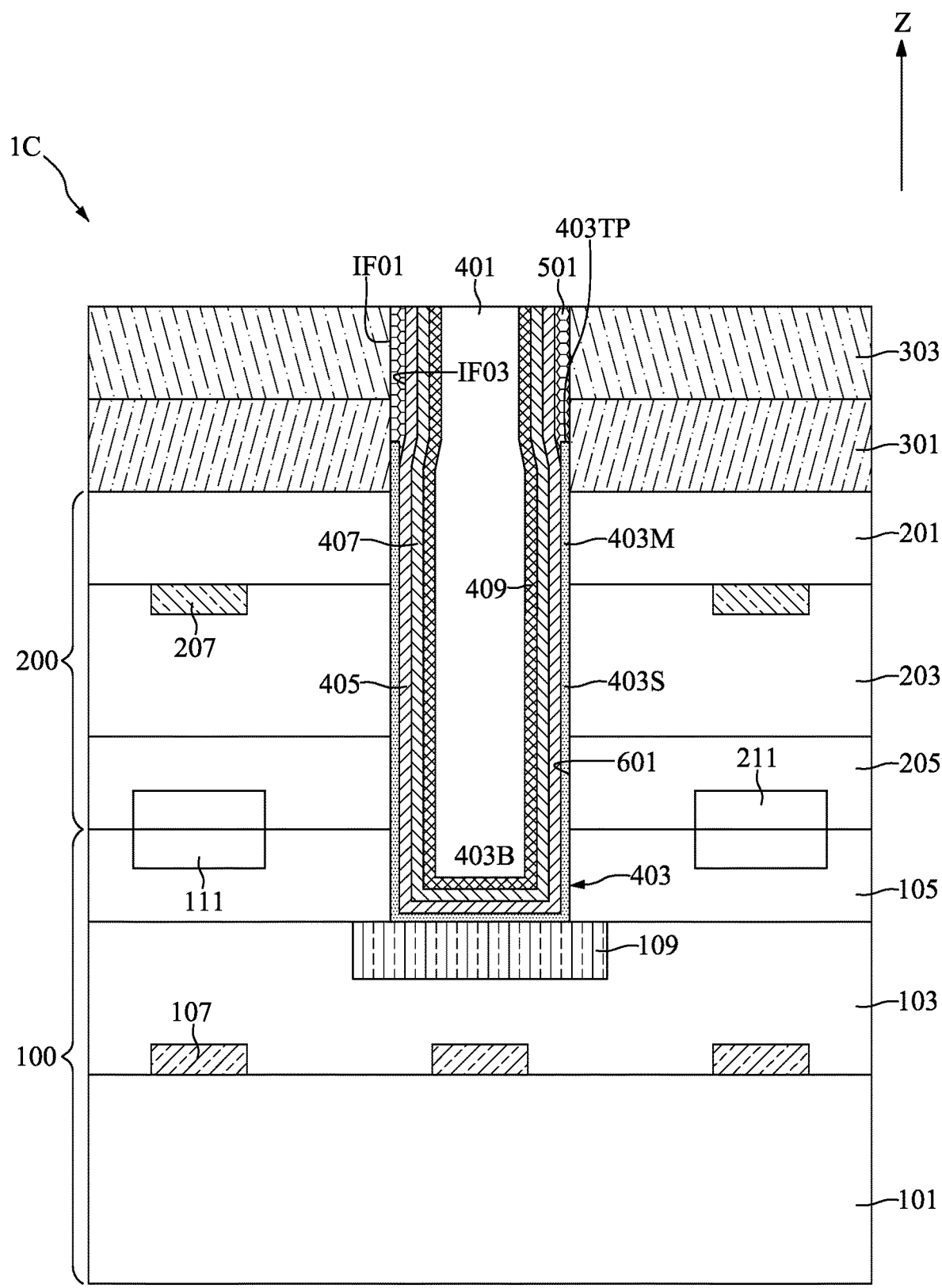

With reference to FIG. 26, a punch etch process may be performed with a procedure similar to that illustrated in FIG. 15. With reference to FIG. 27, the protection layers 501 may be formed to cover the upper portions of the isolation layers 403 with a procedure similar to that illustrated in FIG. 16. With reference to FIG. 28, other elements may be formed with a procedure similar to that illustrated in FIGS. 17 to 21.

Figure 29:
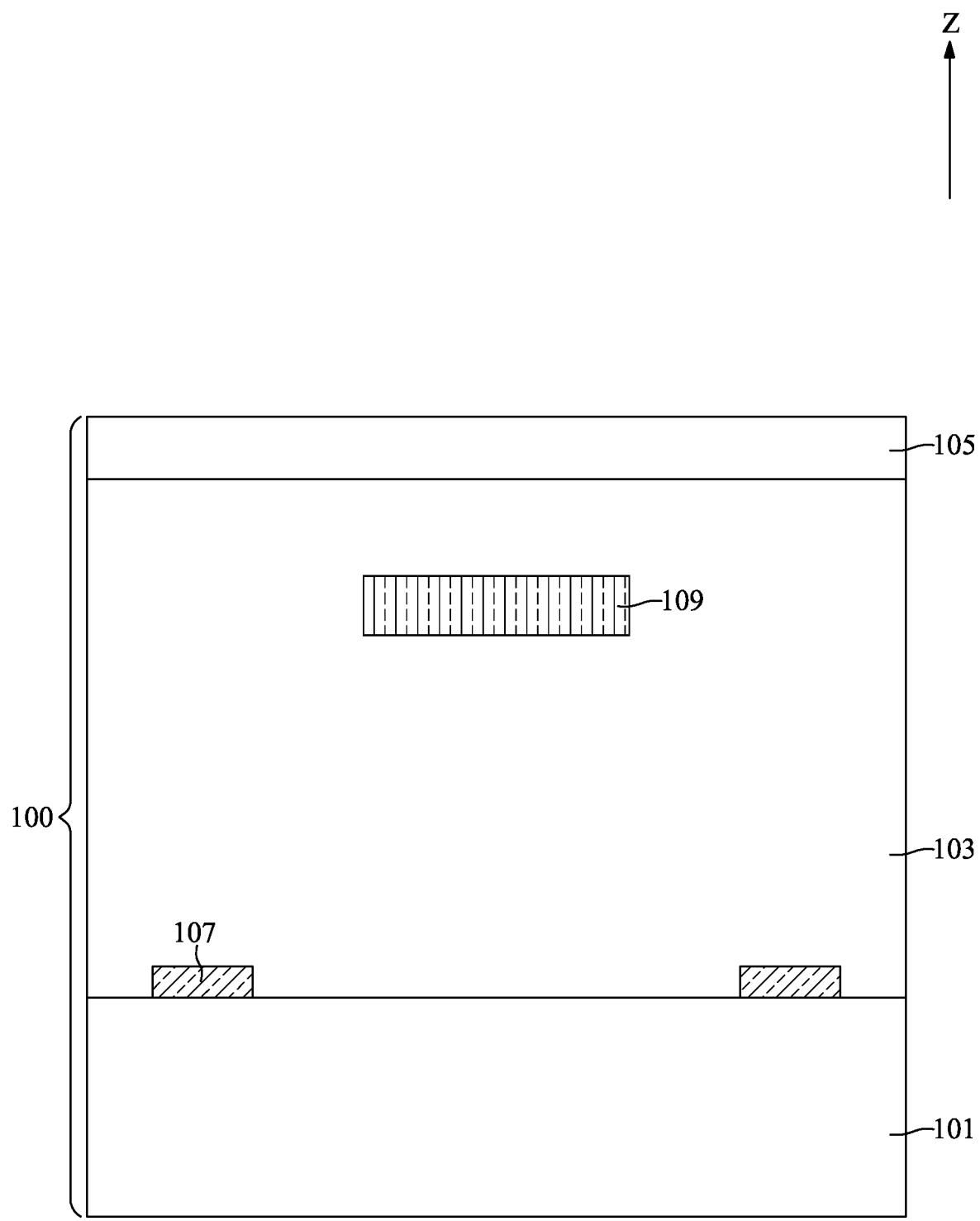
FIGS. 29 to 31 illustrate, in schematic cross-sectional view diagrams, a flow for fabricating a semiconductor device in accordance with another embodiment of the present disclosure.
Figure 30:
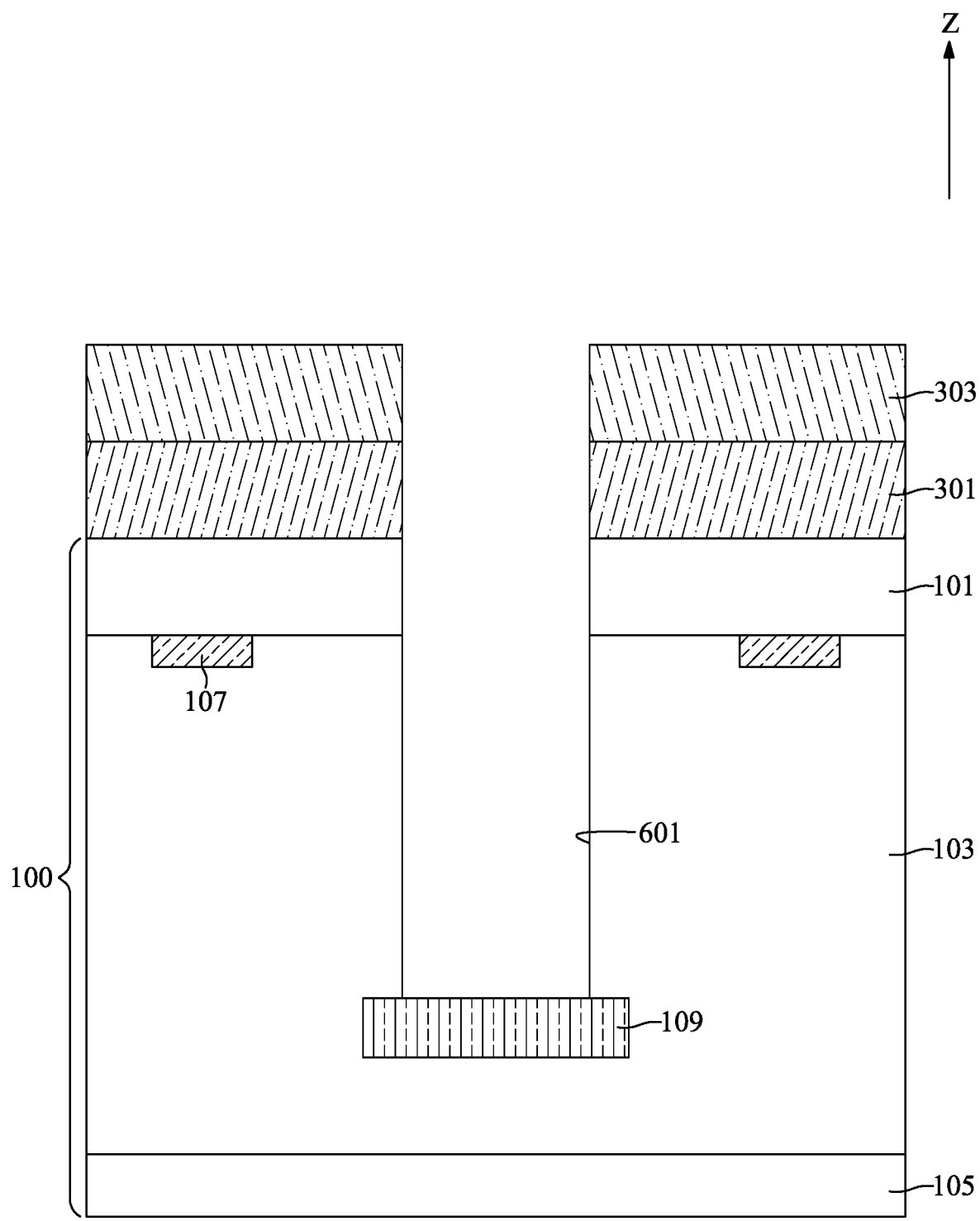
Figure 31:
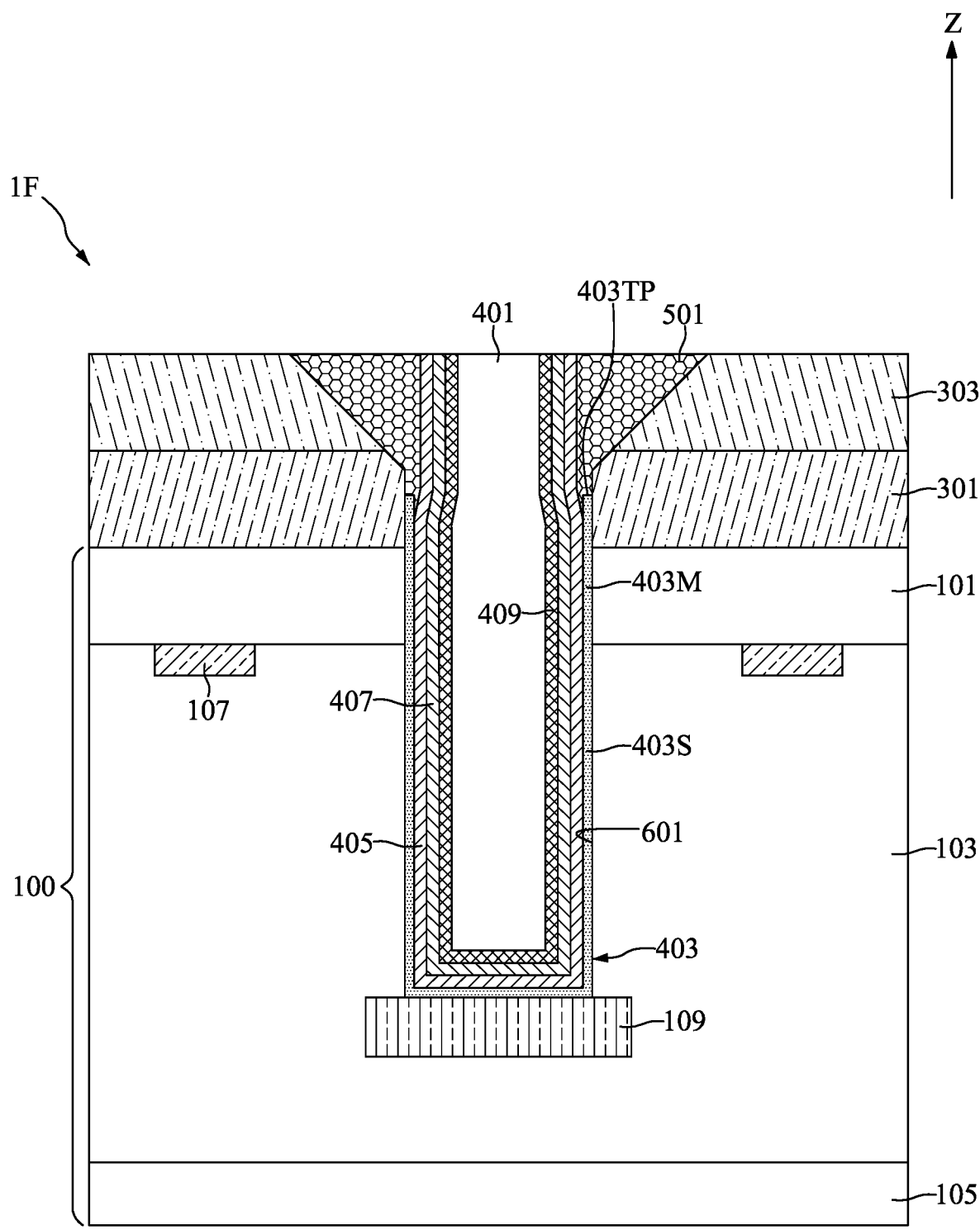

FIGS. 29 to 31 illustrate, in schematic cross-sectional view diagrams, a flow for fabricating a semiconductor device 1F in accordance with another embodiment of the present disclosure.

With reference to FIG. 29, a first die 100 may be provided. The first die 100 may include a first substrate 101, a first dielectric layer 103 formed on the first substrate 101, a first passivation layer 105 formed on the first dielectric layer 103, first device elements 107 formed in the first dielectric layer 103, and a first conductive feature 109 formed in the first dielectric layer 103.

With reference to FIG. 30, the first die 100 may be placed in an up-side down manner. The thickness of the first substrate 101 may be thinned by an etching process, a chemical polishing process, or a grinding process. A first mask layer 301, a second mask layer 303, and a first opening 601 may be formed with a procedure similar to that illustrated in FIGS. 11 and 12. With reference to FIG. 31, other elements may be formed with a procedure similar to that illustrated in FIGS. 13 to 21.

One aspect of the present disclosure provides a semiconductor device including a first die, a first conductive feature positioned in the first die, a second die positioned on the first die, a first mask layer positioned on the second die, a second mask layer positioned on the first mask layer, a conductive filler layer positioned penetrating the second mask layer, the first mask layer, and the second die, extending to the first die, and contacting the first conductive feature, isolation layers positioned between the conductive filler layer and the first die, between the conductive filler layer and the second die, and between the conductive filler layer and the first mask layer, and protection layers positioned between the conductive filler layer and the second mask layer and between the conductive filler layer and the first mask layer, and covering upper portions of the isolation layers.

Another aspect of the present disclosure provides a semiconductor device including a first die, a first conductive feature positioned in the first die, a first mask layer positioned on the first die, a second mask layer positioned on the first mask layer, a conductive filler layer positioned penetrating the second mask layer and the first mask layer, extending to the first die, and contacting the first conductive feature, isolation layers positioned between the conductive filler layer and the first die, between the conductive filler layer and the first mask layer, and between the conductive filler layer and the second mask layer, and protection layers positioned between the conductive filler layer and the isolation layers. Bottommost points of the protection layers are at a vertical level above a vertical level of a bottom surface of the first mask layer.

Another aspect of the present disclosure provides a method for fabricating a semiconductor device including performing a bonding process to bond a second die onto a first die, forming a first mask layer on the second die and forming a second mask layer on the first mask layer, forming a first opening penetrating the second mask layer, the first mask layer, and the second die, and extending to the first die, forming isolation layers on sidewalls of the first opening, forming protection layers covering upper portions of the isolation layers, and forming a conductive filler layer in the first opening.

Due to the design of the semiconductor device of the present disclosure, the protection layers 501 may provide additional protection to avoid the metal to silicon leakage. In addition, due to the geometry of the protection layers 501, the conductive filler layer 401 may be formed without any void. In summary, the yield of fabrication of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
    performing a bonding process to bond a second die onto a first die;
    forming a first mask layer on the second die and forming a second mask layer on the first mask layer;
    forming a first opening penetrating the second mask layer, the first mask layer, and the second die, and extending to the first die;
    forming isolation layers on sidewalls of the first opening;
    forming protection layers covering upper portions of the isolation layers;
    forming a conductive filler layer in the first opening; and
    performing an etch process to expand the first opening in the second mask layer before the step of forming the isolation layers on the sidewalls of the first opening.

2. The method for fabricating the semiconductor device of claim 1, wherein the etch process has an etch rate ratio of the second mask layer to the first mask layer between about 100:1 and about 1.05:1.

3. The method for fabricating the semiconductor device of claim 2, wherein the protection layers are formed of aluminum oxide, hafnium oxide, zirconium oxide, titanium oxide, titanium nitride, tungsten nitride, silicon nitride, or silicon oxide.

* * * * *